United States Patent [19]

Maeda et al.

[11] Patent Number: 5,517,038

[45] Date of Patent: May 14, 1996

[54] SEMICONDUCTOR DEVICE INCLUDING THREE-DIMENSIONALLY DISPOSED LOGIC ELEMENTS FOR IMPROVING DEGREE OF INTEGRATION

[75] Inventors: Shigenobu Maeda; Hirotada Kuriyama, both of Itami, Japan

[73] Assignee: Mitsubishi Denki Kabushiki Kaisha, Tokyo, Japan

[21] Appl. No.: 348,211

[22] Filed: Nov. 28, 1994

Related U.S. Application Data

[63] Continuation of Ser. No. 102,333, Aug. 5, 1993, abandoned.

[30] Foreign Application Priority Data

Aug. 11, 1992 [JP] Japan ................... 4-214306

[51] Int. Cl.[6] ................................. H01L 27/108
[52] U.S. Cl. ............... 257/69; 257/903; 257/72; 257/225; 257/904; 365/181; 365/188
[58] Field of Search ................... 257/903, 904, 257/69, 72, 225, 292, 67; 365/181, 188

[56] References Cited

U.S. PATENT DOCUMENTS

| | | | |
|---|---|---|---|
| 4,805,147 | 2/1989 | Yamanaka et al. | 257/904 |
| 4,852,060 | 7/1989 | Rockett, Jr. | 365/181 |
| 4,902,637 | 2/1990 | Kondou et al. | . |
| 5,001,539 | 3/1991 | Inoue et al. | 257/903 |
| 5,057,898 | 10/1991 | Adan et al. | 257/903 |
| 5,155,058 | 10/1992 | Fujiwara et al. | . |
| 5,321,286 | 6/1994 | Koyama et al. | 257/67 |
| 5,373,170 | 12/1994 | Pfiester et al. | 257/69 |

FOREIGN PATENT DOCUMENTS

| | | | |
|---|---|---|---|
| 0469217 | 2/1992 | European Pat. Off. | . |
| 0469215 | 2/1992 | European Pat. Off. | . |
| 4120248 | 1/1992 | Germany | 365/181 |
| 60-178662 | 9/1985 | Japan | 257/292 |
| 60-87994 | 9/1985 | Japan | 257/903 |
| 61-1900 | 1/1986 | Japan | . |
| 62-18997 | 4/1987 | Japan | . |
| 62-219559 | 9/1987 | Japan | 257/904 |
| 63-37650 | 2/1988 | Japan | . |
| 63-66965 | 3/1988 | Japan | 257/292 |
| 63-119254 | 5/1988 | Japan | . |
| 63-308372 | 12/1988 | Japan | . |
| 2-73666 | 3/1990 | Japan | 257/903 |
| 2-150062 | 6/1990 | Japan | 257/904 |
| 3-34569 | 2/1991 | Japan | . |
| 4-30574 | 2/1992 | Japan | 257/903 |
| 4-30467 | 5/1992 | Japan | . |
| 4-170069 | 6/1992 | Japan | 257/903 |
| 2191893 | 12/1987 | United Kingdom | 257/903 |

OTHER PUBLICATIONS

Hiroshi Okano et al., "Design of Optically Coupled Three–Dimensional Content Addressable Memory", Japanese Journal of Applied Physics, vol. 30, No. 3A, Mar., 1991, pp. L338–L341.

Primary Examiner—Sara W. Crane
Assistant Examiner—Courtney A. Bowers
Attorney, Agent, or Firm—Lowe, Price, LeBlanc & Becker

[57] ABSTRACT

Adjacent memory cells has a two-layer structure formed of first layer and second layer. The first layer is provided with driver transistors of the memory cell, access transistors of the memory cell, and driver transistors formed of the memory cell. The second layer is provided with load transistors of the memory cell, load transistors and of the memory cell, and access transistors of the memory cell. The transistors formed in the first layer are of an NMOS type, and the transistors formed in the second layer are of a PMOS type.

20 Claims, 28 Drawing Sheets

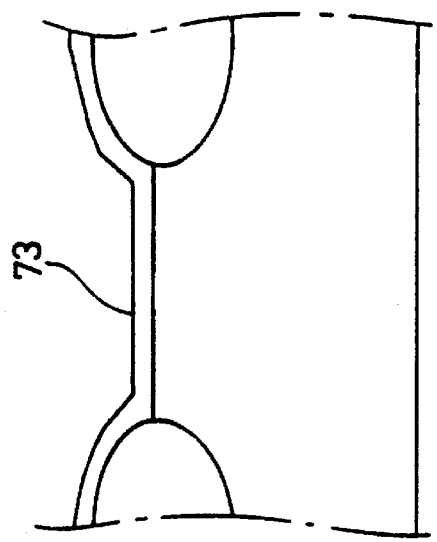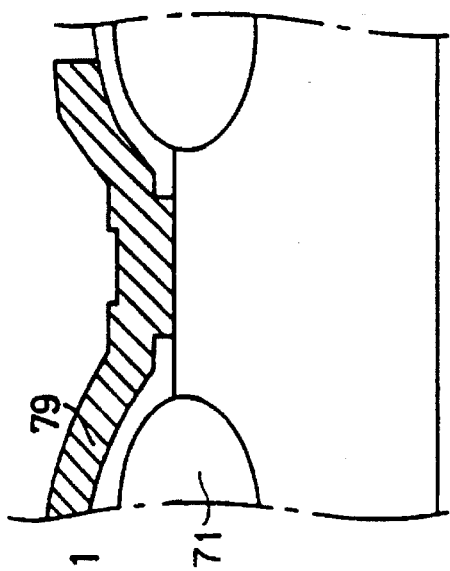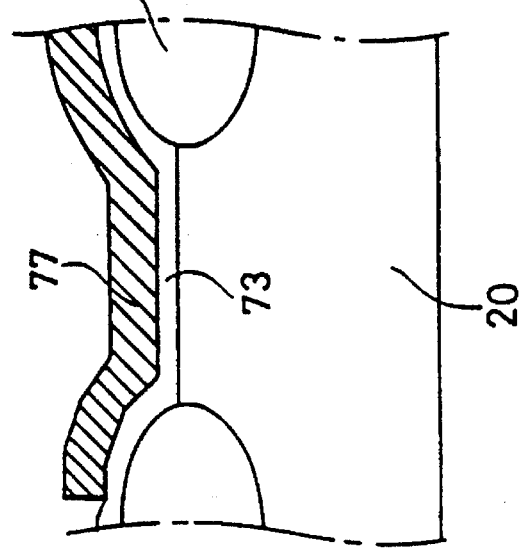

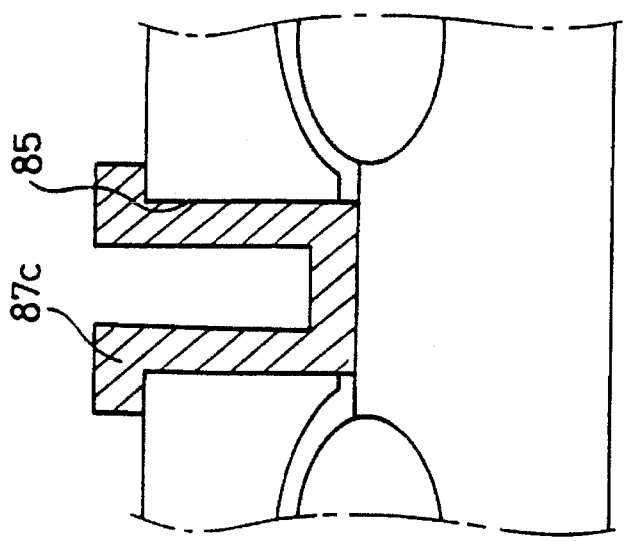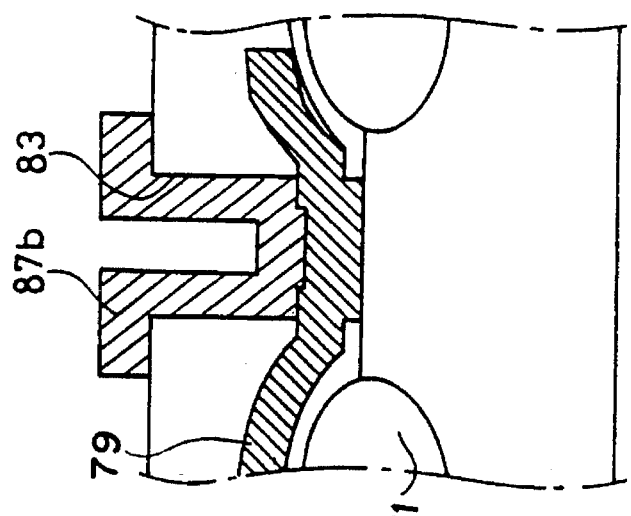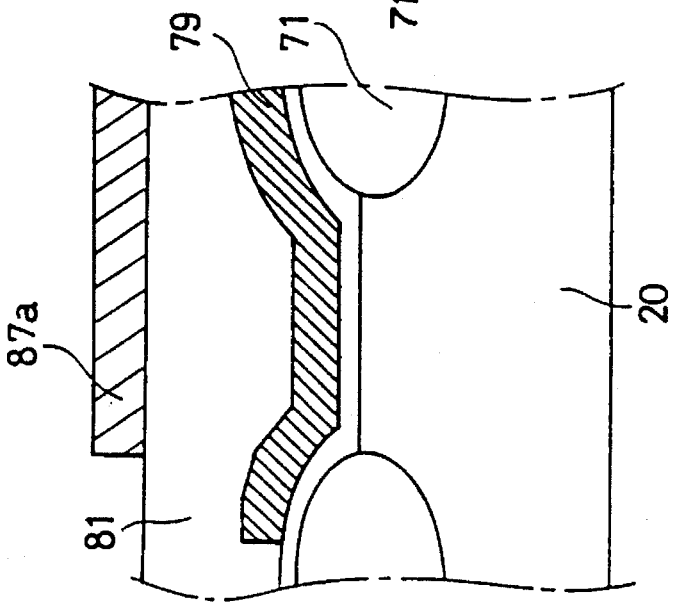

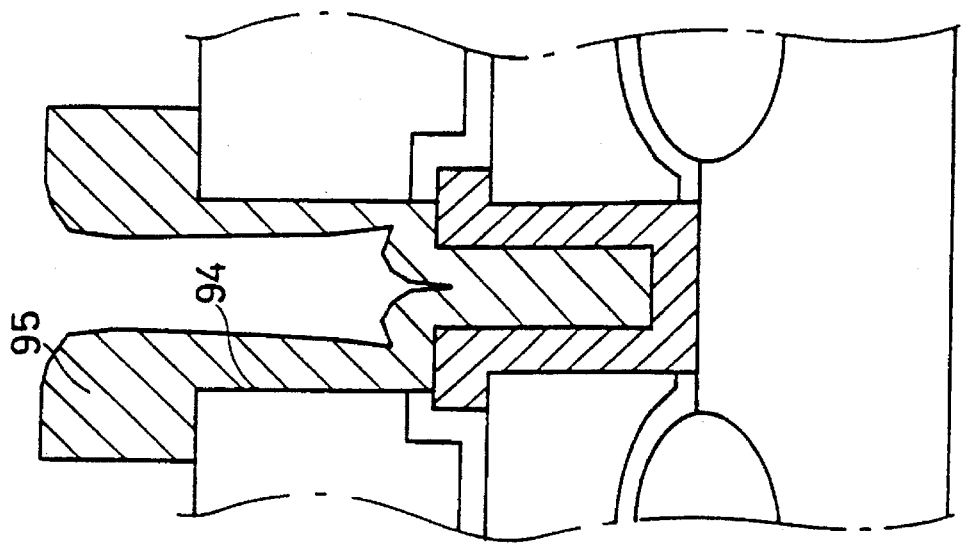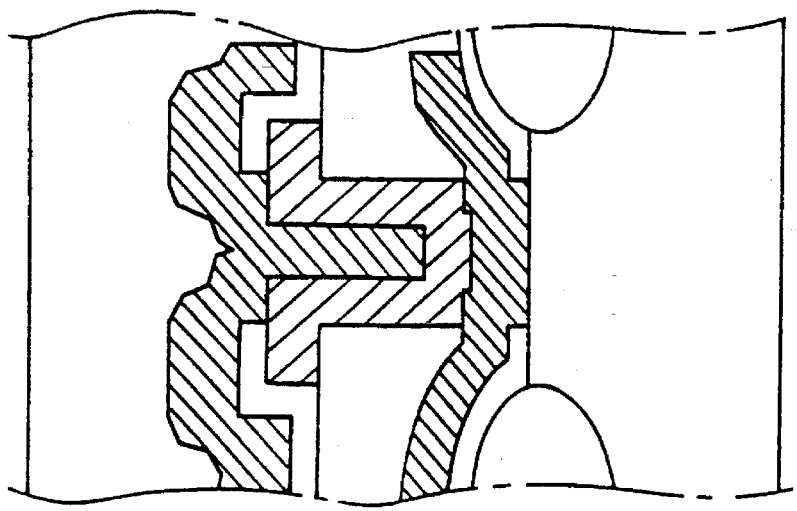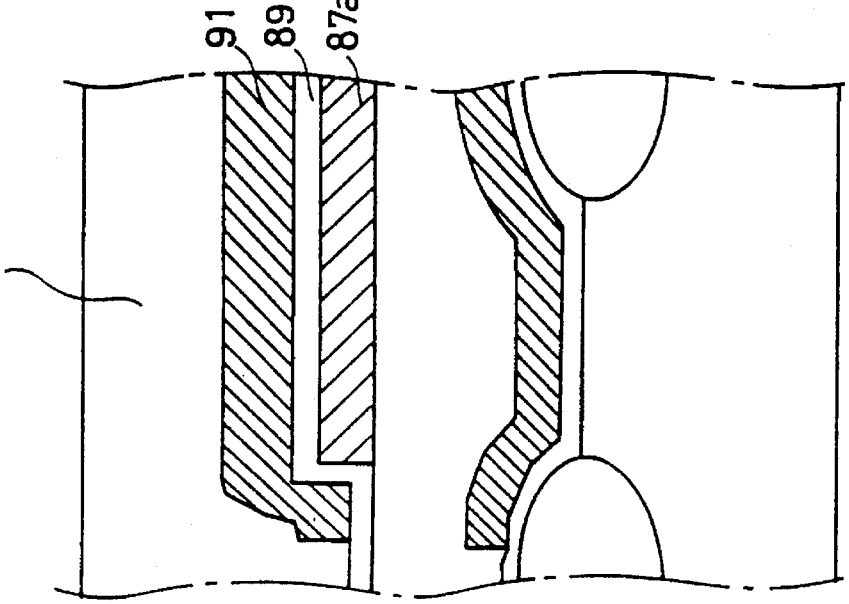

SEMICONDUCTOR DEVICE INCLUDING THREE-DIMENSIONALLY DISPOSED LOGIC ELEMENTS FOR IMPROVING DEGREE OF INTEGRATION

This application is a continuation of application Ser. No. 08/102,333 filed Aug. 5, 1993, now abandoned.

BACKGROUND OF THE INVENTION

1. Field of the Invention

The present invention relates to a semiconductor device, and in particular, to a semiconductor device such as a static semiconductor memory device including multi-layered logic element units.

2. Description of the Background Art

FIG. 31 is a block diagram showing an example of a structure of a static random access memory (will be referred to as "static RAM" hereinafter).

In the figure, a memory cell array 50 includes a plurality of word lines and a plurality of bit line pairs which intersect with each other. Memory cells are disposed at respective intersection of the word lines and bit line pairs. The word lines of the memory cell array 50 are connected to an X-decoder 51, which receives an X-address signal through an X-address buffer 52. The bit line pairs of the memory cell array 50 are connected to a Y-decoder 54 through a transfer gate 53, which receives a Y-address signal through a Y-address buffer 55.

In response to the X-address signal, the X-address decoder 51 selects one of the word lines of the memory cell array 50. In response to the Y-address signal, the Y-address decoder 54 selects one of the bit line pairs of the memory cell array 50. The memory cell, which is disposed at the intersection of the selected word line and the selected bit line pair, is selected. Data is written into or read from the memory cell thus selected. The selection between the write and read of the data is carried out by a read/write control signal R/W applied to a read/write control circuit 56. In the data write operation, input Data Din is applied through a data input buffer 57 into the selected memory cell. In the data read operation, the data stored in the selected memory cell is externally sent therefrom through a sense amplifier 58 and a data output buffer 59 as data Dout.

FIG. 32 is a circuit diagram of a memory cell part in a static RAM having a memory capacity of 1M (mega) in the prior art disclosed in the Japanese Patent Publication No. 62-18997.

In the figure, a plurality of memory cells 101a–101n are connected between a pair of bit line pair 8a and 8b. Each of the memory cells 101a–101n is formed of two MOS field effect transistors (will be referred to as "MOSFETs") of an enhancement type for an inverter, as well as two high-load resistors 104 and 105, and two MOSFETs 6a and 6b for access.

Each drain D of the MOSFETs 4a and 4b is connected to one end of a corresponding high-load resistor 104 or 105, which is made of, e.g., polysilicon and has a high resistance. The other ends of the high-load resistors 104 and 105 are connected to power supply terminals 110 or 111, respectively. The sources S of the MOSFETs 4a and 4b are connected to a ground potential GND.

A gate G of the MOSFET 4a is connected to a node 14b. A gate of the MOSFET 4b is connected to a node 14a. Memory information is stored as potentials in a parasitic capacities 112 and 113 which are located between the node 14a and the ground potential GND and between the node 14b and the ground potential GND, respectively. The node 14a is connected to the bit line 8a through the MOSFET 6a for access, of which gate is connected to corresponding one of the word lines 7a–7n. The node 14b is connected to the bit line 8b through the MOSFET 6b for access, of which gate is connected to corresponding one of the word lines 7a–7n.

The bit lines 8a and 8b are connected to input/output lines I/O 119 and I/O 120 through MOSFETs 117 and 118, respectively, of which gates are connected to an input terminal 121 for receiving a column selection signal from the Y-decoder. The bit lines 8a and 8b are connected through MOSFETs 122 and 123 to connector terminals 124 and 125, to which a supply potential Vcc is applied, respectively. The connector terminals 124 and 125 are diode-connected and serves as loads to the bit lines. The MOSFETs 122 and 123 are provided for precharging the bit lines 8a and 8b. The power supply terminals 110 and 111 receive the power supply potential Vcc.

The memory cells described above operate as follows.

It is assumed that the data is read from the memory cell 101a when the node 14a of the memory cell 101a is at the "L" level, and the node 14b is at the "H" level. In this operation, the potential of the word line 7a changes from 0 V or a value near 0 V, which has been maintained in a non-selected state, to the supply potential Vcc or a value near Vcc, which is a value maintained in a selected state. Therefore, a current flows from the supply terminal 124 toward the ground terminal through the bit line load MOSFET 122, access MOSFET 6a, and inverter MOSFET 4a. Meanwhile, since the inverter MOSFET 4b is in the off-state, the current does not flow through a path extending from the supply terminal 125 to the ground terminal through the bit line load MOSFET 123, access MOSFET 6b and inverter MOSFET 4b. Therefore, the potential of the bit line 8a is set at a potential which depends on an on-state resistance ratio of the MOSFET 122 and MOSFETs 6a and 4a. The bit line 8b is set at a potential which is lower the supply potential Vcc by a threshold voltage of the bit line load MOSFET 123. In this manner, the sense amplifier 58 reads the stored information on the basis of the difference between potentials appearing on the bit lines 8a and 8b of each bit line pair.

In the SRAM of 1M (mega), however, the memory cell 101a includes the high load resistance 104a or 105, which is made of, e.g., polysilicon located between the terminal 110 or 111 and the node 14a or 14b. This cannot sufficiently achieve the high speed and stability of the read operation. It is assumed that the node 14b is held at the "H" level and the word line 7a is selected. In this state, the transistor 6b is turned on, and thus the current flows from the supply terminal 111 through the resistor 105 to the bit line 8b. However, the high-load resistor 105 reduces the voltage, and thus the intended increase of potential of the node 14b does not occur quickly. Therefore, the potential of the bit line 8b does not increase remarkably, so that the reading speed does not sufficiently increase. Further, there is not a significant difference between the potential of the node 14a holding the "L" level and the potential of the node 14b, which impairs the reliability of the reading operation.

In view of the foregoing background, SRAMs of 4M (mega) employ p-channel transistors instead of the high-load resistors 104 and 105 described above for improving the reliability and stability of the reading operation.

FIG. 33 is an equivalent circuit diagram of a memory cell in such SRAM.

In the figure, a memory cell forming one logic element unit is formed of six elements, i.e., driver transistors 4a and 4b, load transistors 5a and 5b, and access transistors 6a and 6b. The access transistors 6a and 6b are connected to the driver transistors 4a and 4b and the bit lines 8a and 8b, respectively, and have gates connected to the word line 7. The access transistors 6a and 6b serve to transfer data between the bit lines and the flip-flop. More specifically, an inverter formed of the driver transistor 4a and load transistor 5a is cross-coupled with an inverter formed of the driver transistor 4b and load transistor 5b to form the flip-flop for storing data. The SRAM of 4M is provided with a first layer, which includes the four transistors 4a, 4b, 6a and 6b formed on a substrate, and is also provided with a second layer, which is located above the first layer and includes two transistors 5a and 5b formed of polysilicon thin-film transistors (TFTs), for reducing a cell area. Thus, NMOS transistors, i.e., the driver transistors and access transistors are formed in the first layer 1, and PMOS transistors, i.e., the load transistors are formed in the second layer 2.

FIG. 34 is a perspective view showing a three-dimensional layout of transistors of memory cells in the conventional SRAM shown in FIG. 33.

In the first layer 1, there are formed the driver transistors 4a and 4b as well as the access transistors 6a and 6b. In the second layer 2, there are formed the load transistors 5a and 5b which are polysilicon TFTs. While there are four transistors in the first layer 1, i.e., on the substrate, only two transistors, i.e., polysilicon TFTs are formed in the second layer. Therefore, the second layer provided with the polysilicon TFTs has a superfluous area for two transistors according to calculation.

In practice, however, the transistor of bulk on the substrate (i.e., transistor having the source and drain formed in the semiconductor substrate) has the performance as the transistor which are different from that of the polysilicon transistors (TFT transistors). Therefore, these transistors have different gate lengths and gate widths in order to achieve sufficient functions as logic elements forming the memory cell. As a result, the area occupied by the four transistors of bulk balances with the that of the two polysilicon TFTs.

However, transistors of an SOI (silicon on insulator) structure, which are comparable to the transistors of bulk, can be formed in the second layer by utilizing a solid-phase growth method for increasing a grain diameter of polysilicon, or by utilizing a technique such as laser recrystallization for monocrystallization or a laminating technique. In the SRAM memory cell formed by the above technique or method, the bulk transistors in the first layer and the SOI transistors in the second transistors have nearly equal performance. Therefore, the area occupied by the access transistors of the NMOS type in the first layer can be equal to that of the load transistors of the PMOS type in the second layer.

FIG. 35 is a perspective view showing an element layout corresponding to the equivalent circuit shown in FIG. 33. FIG. 36 is a cross section of a structure in FIG. 35.

Referring to FIG. 35, the first layer is provided with the driver transistors 4a and 4b and access transistors 6a and 6b, and the second layer is provided with the load transistors 5a and 5b. As already stated, if the transistors in the second layer are formed comparably to the transistors of bulk, the respective transistors occupy the substantially equal areas. As shown in FIG. 35, therefore, the area occupied by the transistors in the first layer significantly differs from the area occupied by the transistors in the second layer 2. In the state shown in FIG. 36, two memory cells in FIG. 35 are disposed in parallel. As also can be seen from FIG. 36, superfluous spaces are formed in the second layer.

In conclusion, the development in the technique for forming the transistors in the second layer results in the layout of low efficiency relating to the degree of integration, so long as the memory cells employ the present structures.

SUMMARY OF THE INVENTION

Accordingly, it is an object of the invention to provide a semiconductor device of which degree of integration is improved.

Another object of the invention is to provide a semiconductor device in which efficiency of a layout of logic elements is improved.

Still another object of the invention is to provide a semiconductor device in which logic elements are three-dimensionally disposed.

In order to achieve the above objects, a semiconductor device according to an aspect of the invention includes a semiconductor substrate having a main surface, a predetermined number of first logic elements of a first conductivity type formed on the main surface of the semiconductor substrate, an insulating layer formed on the first logic elements, and second logic elements which are formed on the insulating layer, are equal in number to the first logic elements and are of a second conductivity type opposite to the first conductivity type, wherein the first and second logic elements form at least one logic element unit.

In the semiconductor device thus constructed, the logic element unit is formed of the first logic elements and the second logic elements, which are equal in number to each and are formed in two layers, respectively. Therefore, the efficient layout is achieved and the degree of integration of the device is improved.

In order to achieve the above objects, another aspect of the invention provides a static semiconductor memory device including a first memory cell and a second memory cell neighboring to the first memory cell, each utilizing transistors which form a flip-flop, for storing information, wherein said first memory cell includes a pair of first driver transistors forming a part of a first flip-flop, a pair of first load transistors forming another part of the first flip-flop and each being connected to each of the first driver transistors, a first supply potential applying circuit connected to each of the first load transistors for applying a supply potential, a first ground potential applying circuit connected to each of the first driver transistors for applying a ground potential, a pair of first access transistors each being connected to a connection portion between each of the first driver transistors and each of the first load transistors, a pair of first bit lines connected to each of the first access transistors, and a first word line connected to a gate electrode of each of the first access transistors, the second memory cell includes a pair of second driver transistors forming a part of a second flip-flop, a pair of second load transistors forming another part of the second flip-flop and each being connected to each of the second driver transistors, a second supply potential applying circuit connected to each of the second load transistors for applying a supply potential, a second ground potential applying circuit connected to each of the second driver transistors for applying a ground potential, a pair of second access transistors each being connected to a connection portion between each of the second driver transistors and each of the second load transistors, a pair of second bit lines connected to each of the second access transistors, and a second word line connected to a gate electrode of each of the second access transistors, the first and second driver transistors and the first access transistors are of a first conductivity type, and the first and second load transistors and the second access transistors are of a second conductivity type opposite to the first conductivity type.

In the static semiconductor memory device thus constructed, the first and second memory cells are formed of the transistors of the first conductivity type and the transistors of the second conductivity type, which are equal in number. This enables the efficient disposition of the memory cells.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A–12C to FIGS. 17A–17C are cross sections showing first to sixth steps in a manufacturing process of memory cell structures in FIG. 1;

DESCRIPTION OF THE PREFERRED EMBODIMENT

[First Embodiment]

Figure 1:
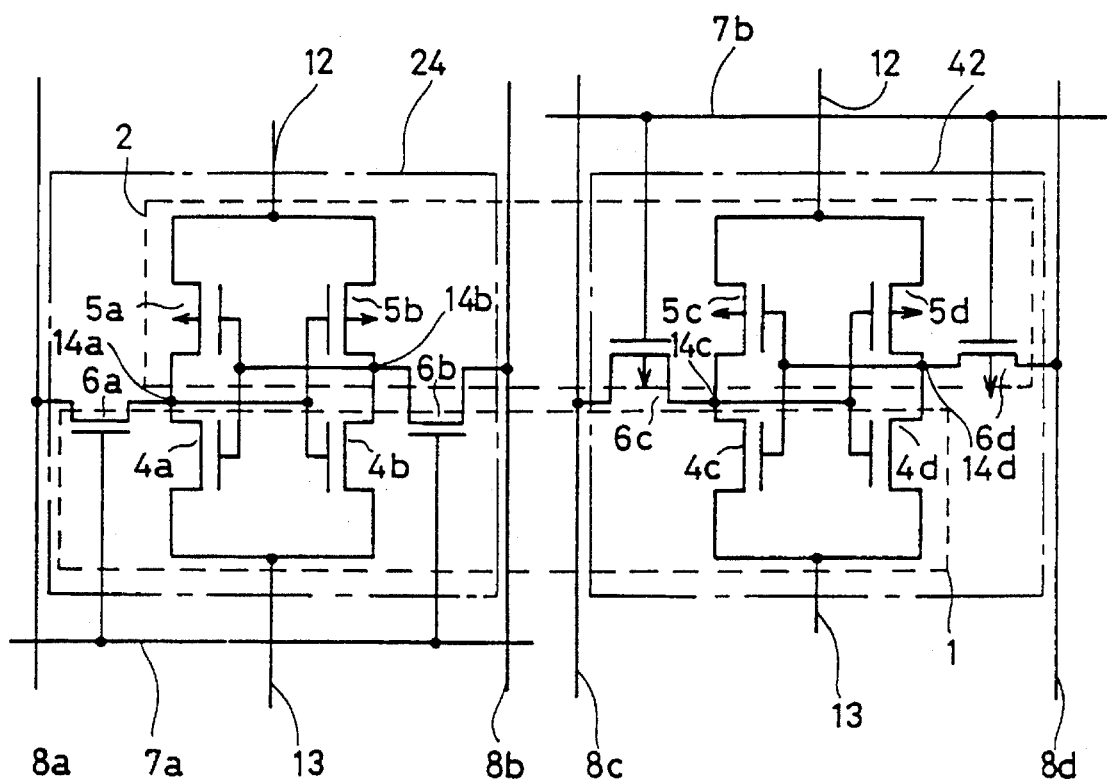
FIG. 1 is an equivalent circuit diagram showing structures of memory cells of a first embodiment of the invention.

FIG. 1 is an equivalent circuit diagram showing structures of memory cells of a first embodiment of the invention.

Figure 5:
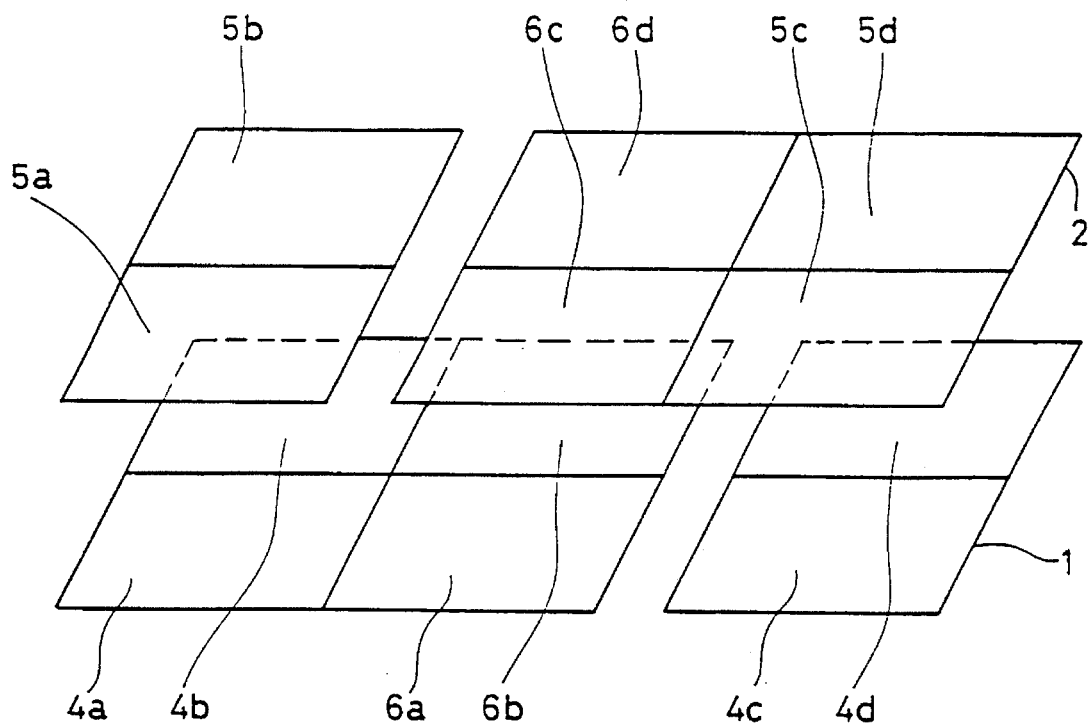
FIG. 5 is a perspective view showing an element layout corresponding to an equivalent circuit of memory cells in FIG. 1.

In the figure, there is shown an equivalent circuit in which a memory cell 24 is formed between the pair of bit lines 8a and 8b, and a memory cell 42 is formed between a pair of the bit lines 8c and 8d neighboring to the bit lines 8a and 8b. The structure of the memory cell 24 is similar to the equivalent circuit of the memory cell structure in the prior art shown in FIG. 33, and thus will not be described hereinafter. The structure of the memory cell 42 is basically similar to that of the memory cell 24, except for that access transistors are p-channel transistors. More specifically, the access transistors 6a and 6b in the memory cell 24 are n-channel transistors, while the access transistors in the memory cell 42 are p-channel transistors. In this embodiment, the adjacent memory cells 24 and 42 are deemed to form one set. The n-channel MOS transistors are formed in the first layer 1 which is formed in the semiconductor substrate, and the p-channel SOI transistors are formed in the second layer 2 which is located above the semiconductor substrate. FIG. 5 is a perspective view showing a layout of elements corresponding to the equivalent circuit in FIG. 1, and FIG. 6 is a cross section of structures of elements in FIG. 5.

Figure 6:
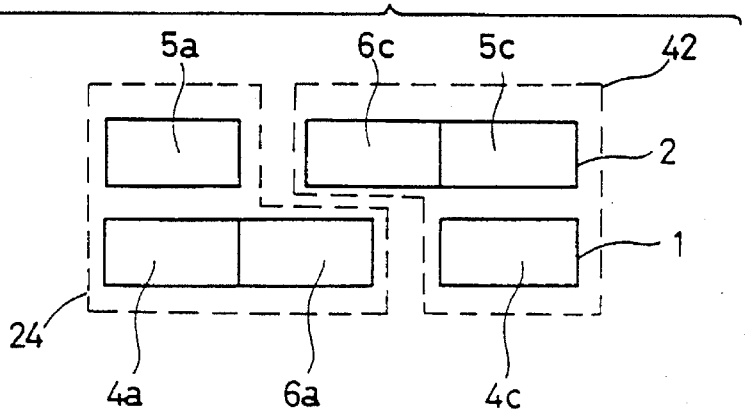
FIG. 6 is a cross section of structure of memory cells in FIG. 5.

In FIG. 6, the memory cell 24, which forms one logic element unit surrounded by dashed line, includes two transistors in the second layer 2 and four transistors in the first layer 1, and will be referred to as "2/4 type memory cell".

The memory cell 42, which forms one logic element unit, includes four transistors in the second layer and two transistors in the first layer, and will be referred to as "4/2 type memory cell".

The first layer 1 is formed of monocrystal substrate, SOI or polysilicon. The second layer 2 is formed of SOI or polysilicon.

The 2/4 type memory cell 24 is provided at the first layer 1 with the driver transistors 4a and 4b and access transistors 6a and 6b, and is provided at the second layer 2 with the load transistors 5a and 5b. The 4/2 type memory cell 42 is provided at the first layer 1 with the driver transistors 4c and 4d, and is provided at the second layer 2 with the access transistors 6c and 6d and load transistors 5c and 5d.

As shown in FIG. 5, the two memory cells are disposed so that the access transistors 6c and 6d of the 4/2 type memory cell are located above the access transistors 6a and 6b of the 2/4 memory cell 24. Thus, in the adjacent two memory cells, the first layer includes six transistors, and the second layer also includes six transistors. Therefore, a superfluous region is eliminated and an efficient layout is enabled. This can reduce a total area of the semiconductor device.

In addition to the memory cells in the SRAM described above, the invention can be applied to the cases where one circuit unit includes a plurality of transistors arrayed in one row or in a matrix form, and, in the one circuit unit, the transistors formed in the first layer are different in number to the transistors formed in a second layer. For example, in the case where one circuit unit is provided at the first layer with transistors of a number a and is provided at the second layer with transistors of a different number b, the total area of the circuit can be reduced by the alternate combination of b/a type circuit units, each of which is provided with the first layer including the transistors of a in number and the second layer including the transistors of b in number, and a/b type circuit units, each of which is provided with the first layer including the transistors of b in number and the second layer including the transistors of a in number.

Figure 3:
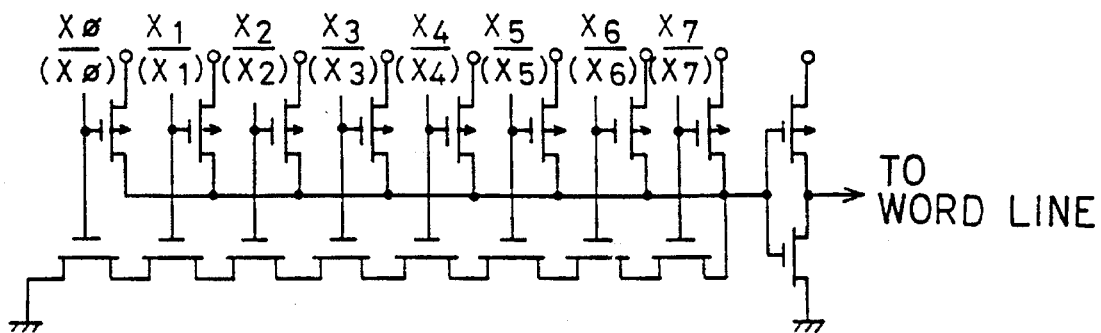
FIG. 3 is a circuit diagram showing an example of a driver circuit for a word line corresponding to the memory cell structures in FIG. 1.
Figure 4:
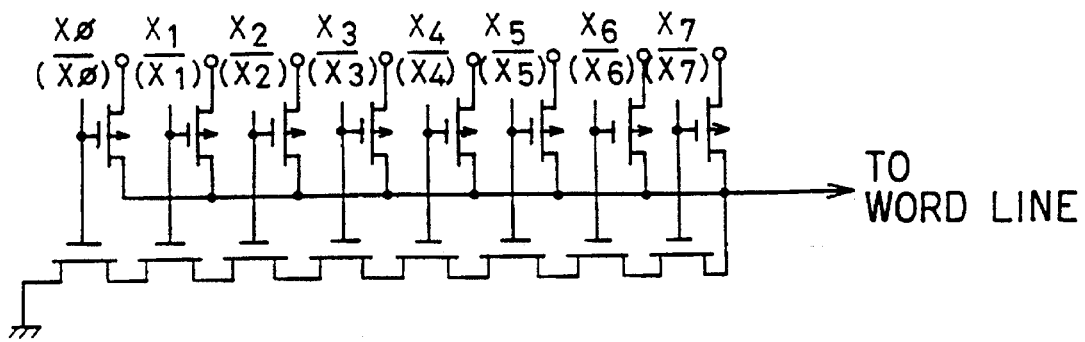
FIG. 4 is a circuit diagram showing another example of a driver circuit for a word line corresponding to the memory cell structures in FIG. 1.

FIGS. 3 and 4 are circuit diagrams showing circuits for driving a word line in the memory cell structures in FIG. 1.

In a two-dimensional disposition of the memory cells, an X-address and a Y-address are used to select each memory cell. The X-address corresponds to one word line. In the SRAM showing in the circuit diagram of FIG. 1, the memory cells 24 including the access transistors 6a and 6b formed of n-channel MOS transistors are disposed alternately to the memory cells 42 including the access transistors 6c and 6d formed of p-channel SOI transistors. As a potential for turning on the transistors 6a and 6b is different from a potential for turning on the transistors 6c and 6d, different potentials must be applied to the word lines thereof for driving them. FIGS. 3 and 4 show simple examples of an X-decoder for the SRAM memory cell array including 256 rows aligned in the X direction.

It is assumed that the row addresses of the memory cells having NMOS access transistors are designated by a binary number (X0, X1, X2, X3, X4, X5, X6, X7), where numbers X0–X6 each are 0 or 1 and the number X7 is 0. It is also assumed that the row addresses of the memory cells having PMOS access transistors are designated by a binary number (X0, X1, X2, X3, X4, X5, X6, X7), where numbers X0–X6 each are 1 or 0 and the number X7 is 1. In this case, the decoder for forming each word line may have the structure shown in FIGS. 3 and 4. The circuit in FIG. 3 is formed of NAND circuits for X0 ($\overline{X0}$)–X7 ($\overline{X7}$) and an inverter. The circuit in FIG. 4 is formed of only NAND circuits for X0 ($\overline{X0}$)–X7 ($\overline{X7}$).

Description will be made, for example, in connection with the case where the X-address is (11001010) and the row includes the access transistors of the n-channel type. If the input of the X-decoder in FIG. 3 is connected to X0, X1, $\overline{X2}$, $\overline{X3}$, X4, $\overline{X5}$, X6 and $\overline{X7}$ the potential of the word line attains the "H" level only in the case of (X0– X7)= (11001010), and thereby the access transistors 6a and 6b are turned on.

Then, description will be made in connection with the case where the X-address is (10010011) and the row includes the access transistors of the p-channel type. If the input of the X-decoder in FIG. 4 is connected to X0, $\overline{X1}$, $\overline{X2}$, X3, $\overline{X4}$, $\overline{X5}$, X6 and X7, the potential of the word line attains the "L" level only in the case of (X0–X7)= (10010011), and thereby the access transistors 6c and 6d are turned on.

Figure 7:
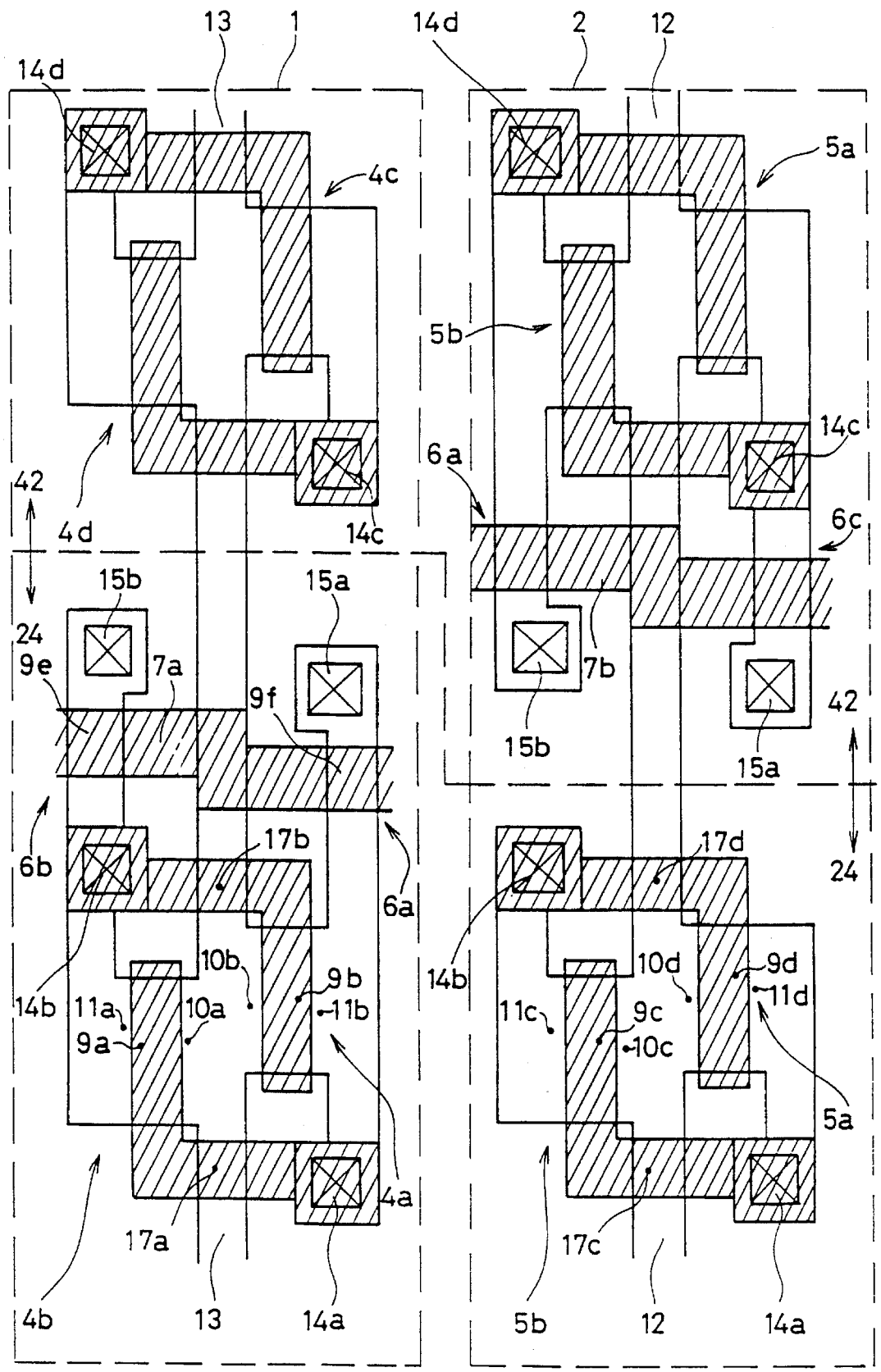
FIG. 7 shows a specific interconnection pattern in memory cell structures in FIG. 1.

FIG. 7 shows a specific interconnection pattern of the equivalent circuit in FIG. 1.

Although FIG. 7 shows the interconnection pattern for the memory cells shown in FIG. 1, the memory cells are not restricted to such interconnection pattern provided that the total occupied area of the semiconductor device can be reduced by the combination of 2/4 type memory cells and 4/2 type memory cells.

In FIG. 7, the left portion shows an interconnection pattern for the first layer 1, and the right portion shows an interconnection pattern of the second layer 2. Reference numerals correspond to those in FIG. 1. Memory nodes 14a–14d correspond to contacts between the first and second layers 1 and 2. Contacts 15a and 15b are also formed between the first and second layers 1 and 2 and are connected to the bit lines.

Regions indicated by hatching form gates of the transistors as well as the word lines 7a and 7b. A capacities 17a or 17b is formed between each gate of the driver transistors 4a–4d, and a capacity 17c or 17d is formed between each gate of the load transistors 5a and 5d and a power supply potential (Vcc) line 12.

In the memory cells exemplified in FIG. 7, transistors having a performance comparable to bulk are formed in the second layer, the driver transistors and load transistors have the same configurations, and the layout of the driver and load transistors in the first layer is the same as that in the second layer. As can be seen from FIG. 1, a gate 9a of the driver transistor 4b may be common to a gate 9c of the load transistor 5b, and a gate 9b of the driver transistor 4a may be common to a gate 9d of the load transistor 5a.

Figure 8:
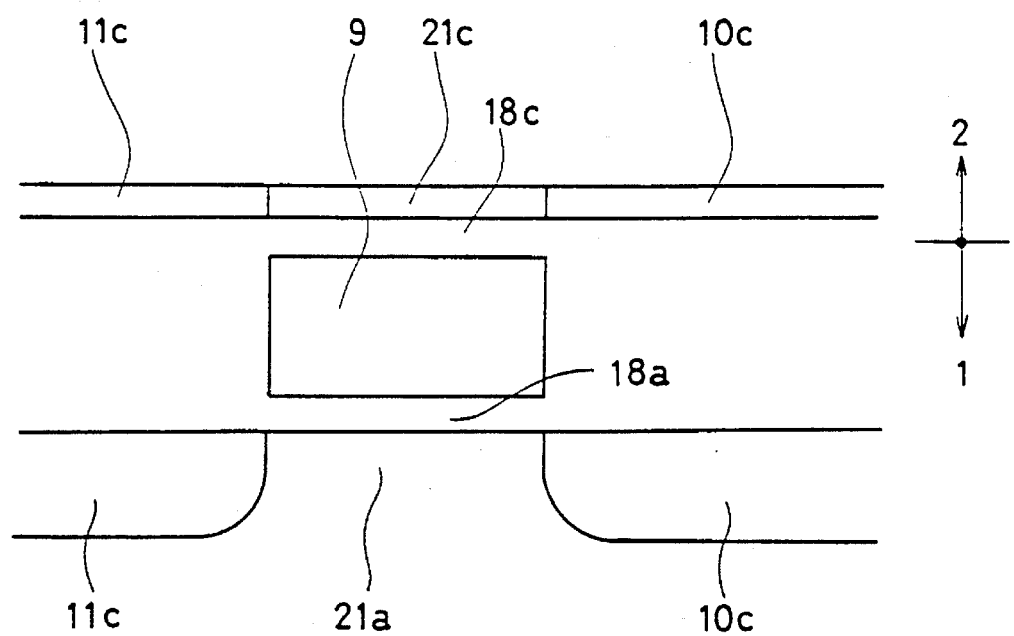
FIG. 8 is a cross section showing a structure of a gate electrode of a driver transistor and a load transistor in a memory cell structure in FIG. 1.

FIG. 8 is a cross section of a structure including a common gate.

In the figure, a channel 21c of the transistor in the second layer 2 is located above the common gate 9, which also serves as the gate of the transistor in the first layer 1. The provision of the common gate 9 can simplify the manufacturing process. In this case, the first and second layers have the completely same layouts. However, even such a layout that only a part of the gate is commonly used can simplify the manufacturing process.

Figure 9:
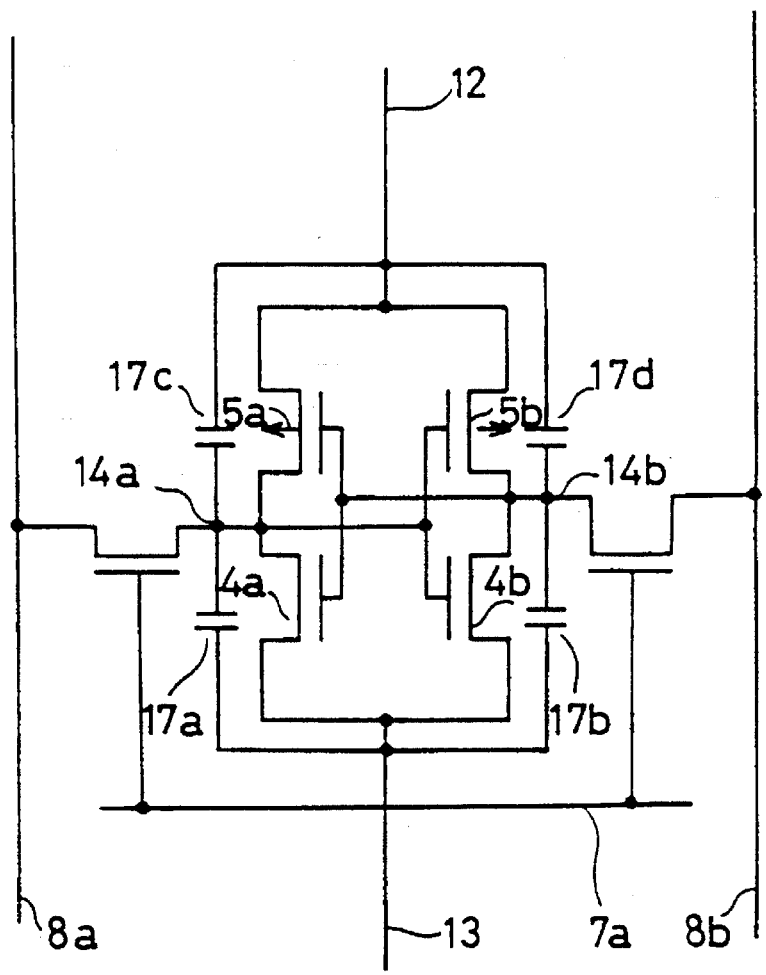
FIG. 9 is a circuit diagram equivalently showing capacities forming in a memory structure in FIG. 1.

In the memory cells in FIG. 7, the first layer 1 includes the capacities 17a and 17b formed between the memory nodes 14a and 14b and the GND line 13, respectively, and the second layer 2 includes the capacities 17c and 17d formed between the memory nodes 14a and 14b and the GND line 13, respectively. This increases a data holding performance of the memory cells, and effectively suppresses soft error. FIG. 9 is an equivalent circuit diagram for showing this effect.

Figure 10:
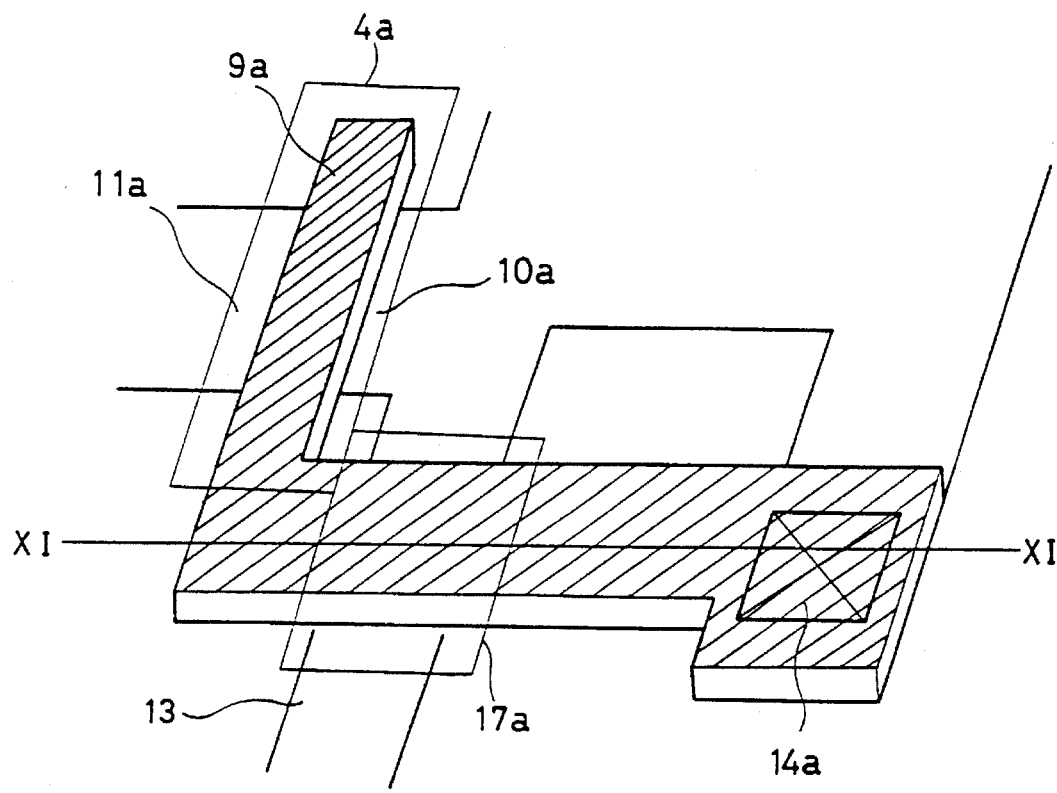
FIG. 10 is a perspective view of a specific interconnection structure for showing a state of formation of a capacity in FIG. 9.
Figure 11:
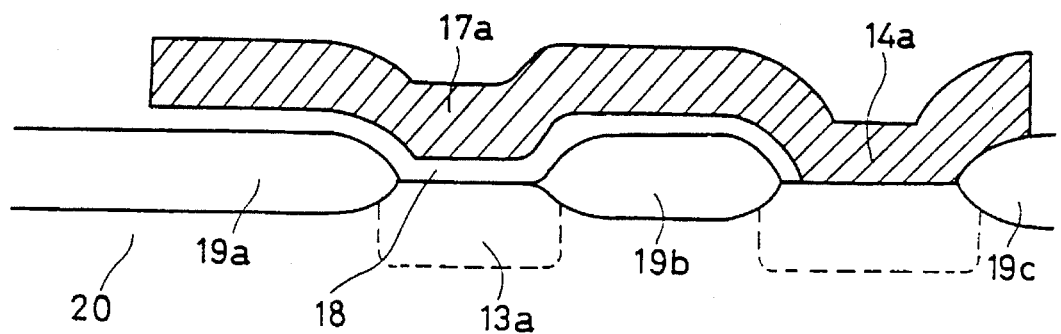
FIG. 11 is a cross section taken along line XI—XI in FIG. 10.

FIG. 10 is a perspective view showing a specific structure of and around the capacity 17a in FIG. 7. FIG. 11 is a cross section taken along line XI–IX in FIG. 10.

In the figures, an L-shaped interconnection layer 9a extends across the GND line 13. The interconnection layer 9a has one end functioning as a gate electrode of the driver transistor 4a and the other end forming a node 14a, i.e., a contact. It can be seen that the capacity 17a is formed by the crossing structure of the interconnection layer 9a over the GND line 13. As described above, the capacity exists between the memory node 14 and the GND line 13 located at opposite sides of an insulating film 18. Since this capacity stores the electric charge of the memory node, the data holding ability of the memory cell increases.

In FIG. 10, a source 10a and a drain 11a of the transistor 4a is formed by implanting impurity, using the gate as a mask. Even if the impurity is implanted in this manner, the impurity is not implanted into a portion 13a (not shown) under the capacity 17a. In this memory cell, since the portion 13a is used as a part of the GND line 13, a high resistance of this portion must be prevented. For this purpose, following steps or others are required. The impurity is implanted in advance into the portion 13a, or only the gate 9a of the driver transistor 4a is patterned prior to the patterning of the other portions. Then, the impurity is implanted also into the GND line in the impurity implanting operation for forming the source/drain. Thereafter, the gate 9a and the memory node 14a are connected together. The same is true with respect to the formation of the capacity between the gate of the load transistor and the supply potential line.

FIGS. 12A–12C to FIGS. 17A–17C are cross sections showing a manufacturing method of the memory cell structures corresponding to those shown in FIG. 7. These figures show sectional structures in accordance with an order of steps, and the transistor part, the contact part between the first and second layers and the contact part to an aluminium interconnection are separately shown at A, B and C in these figures, respectively.

Figure 12C:
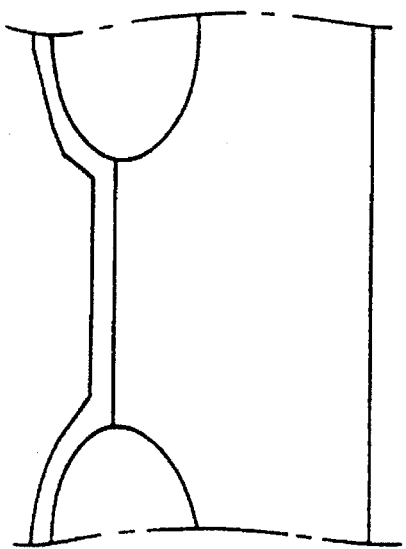
Figure 12B:
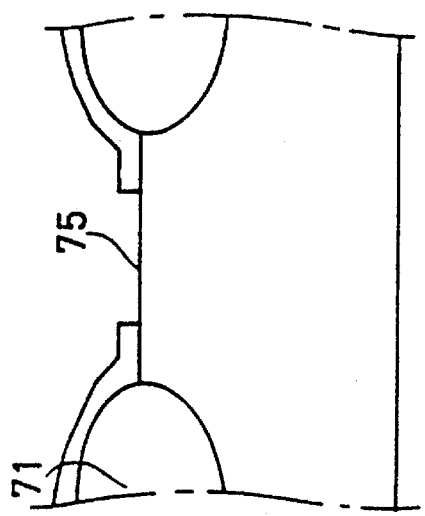
Figure 12A:
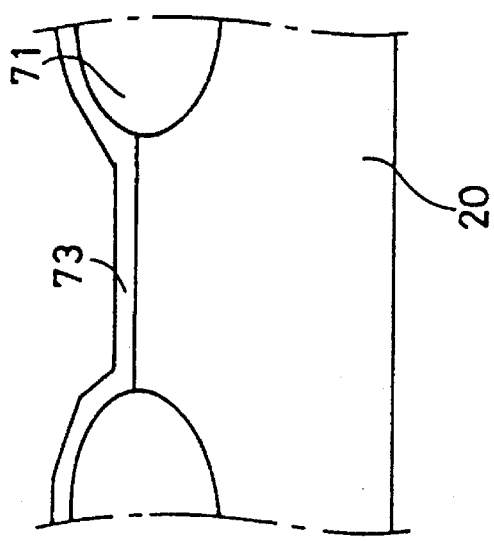

First, in order to form an active region on a main surface of a semiconductor substrate 20, a field oxide film 71 is formed, e.g., by an LOCOS method. Then, the main surface of semiconductor substrate 20 is subjected to thermal oxidation to form a gate oxide film 73 on the whole surface. An opening is formed in a predetermined portion of the film 73 to form a contact 75, using, e.g., a resist as a mask (FIG. 12A–12C).

Polysilicon is formed on the whole surface of the gate oxide film 73 and then is patterned into predetermined configurations to form a gate electrode 77 and an interconnection layer 79 connected to thereto. In the contact part (FIG. 13C) to the aluminium interconnection the polysilicon is entirely removed by etching (FIGS. 13A–13C).

Figure 14C:
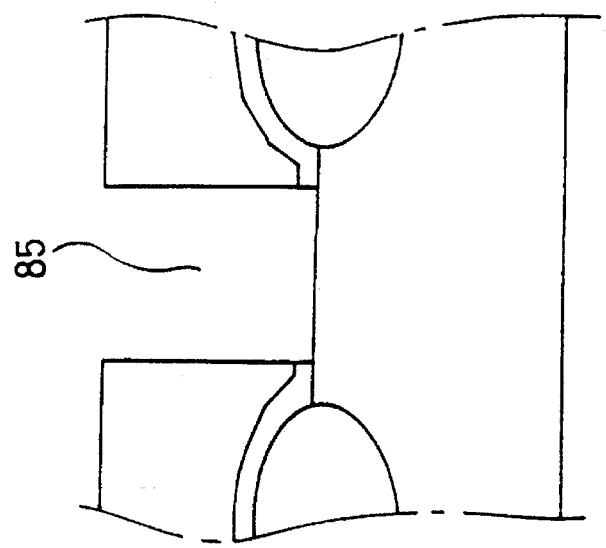
Figure 14B:
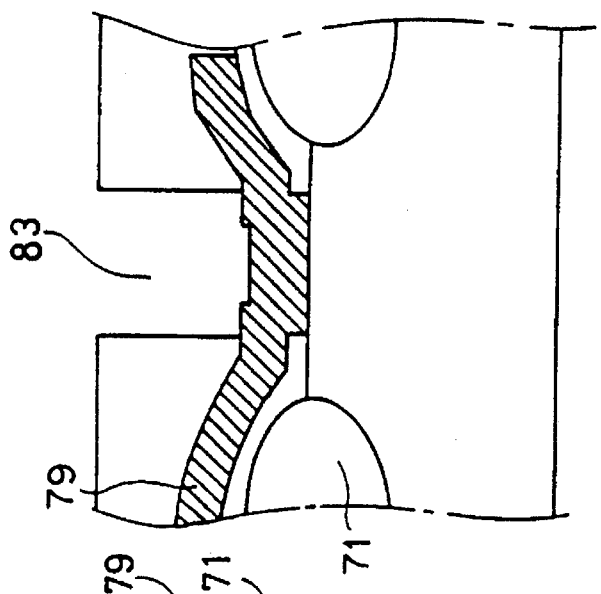
Figure 14A:
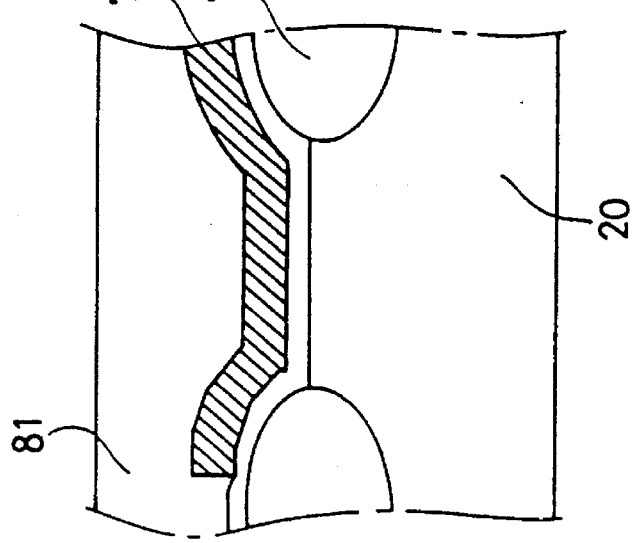

Then, an interlayer insulating film 81 is formed on the whole surface of the gate electrode layer 79 and the exposed portion of the gate oxide film 73. The interlayer insulating film 81 is provided for separating the first and second layers from each other. After flattening the interlayer insulating film, a contact hole 83 is formed for connecting the first and second layers to each other. In the aluminium contact part (FIG. 14C), a contact hole 85 is formed for exposing the main surface of semiconductor substrate 20 (see FIGS. 14A–14C).

Polysilicon is formed fully over the interlayer insulating film 81 and contact holes 83 and 85, and is patterned into predetermined configurations to form active region layers 87a, 87b and 87c. These active region layers are monocrystallized by the solid-phase growth method or laser recrystallization method. Information relating to crystal orientation of the crystal surface of the substrate can be fetched through the contact part (FIG. 15B) and the aluminium contact part (see FIG. 15C).

Figure 16C:
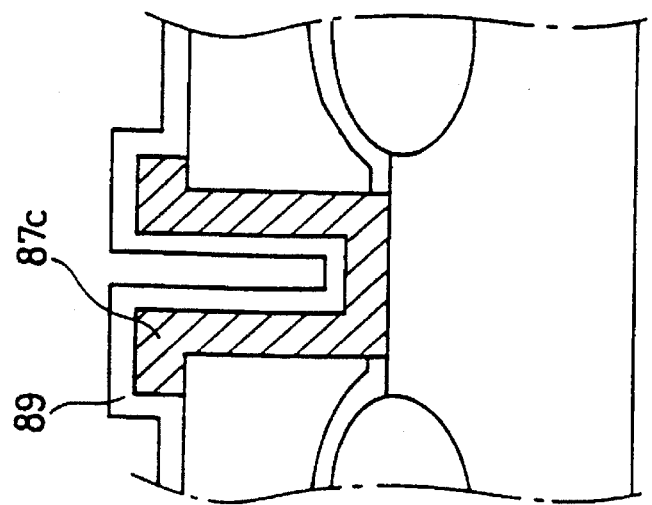
Figure 16B:
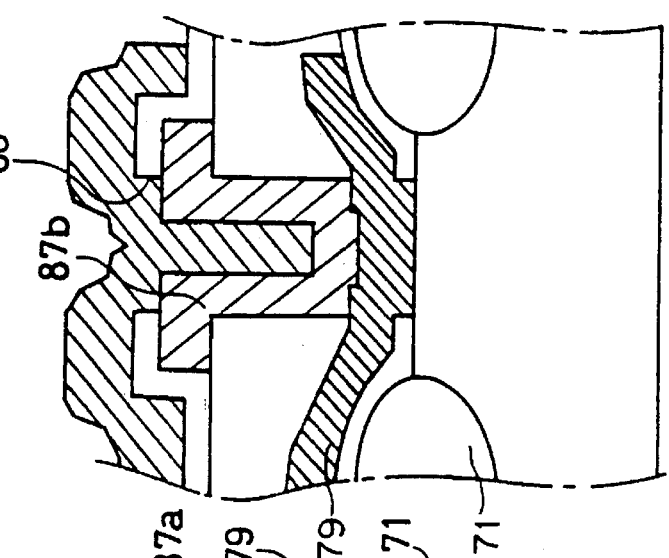
Figure 16A:
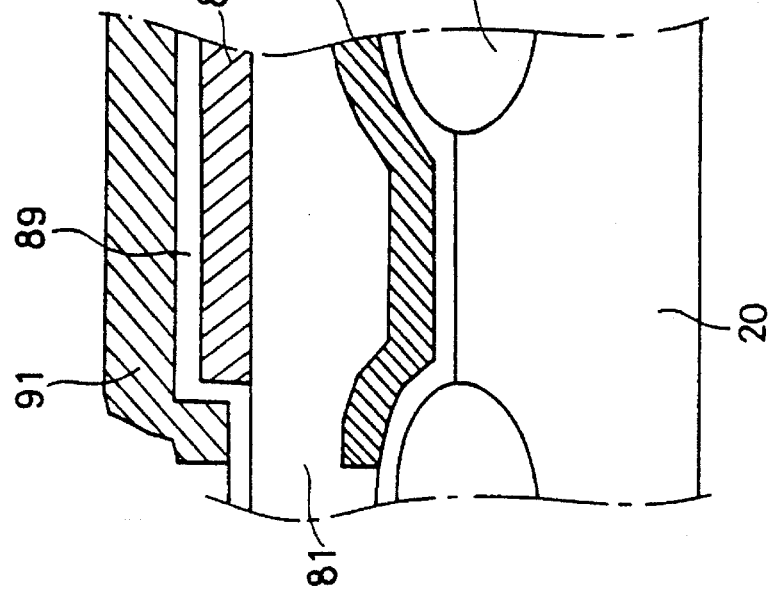

A gate insulating film 89 is formed fully over the active regions 87a–87c, and an opening 88 is formed only in the active region 87b. Polysilicon for forming the gate electrode is formed fully over the gate insulating film 89, and is patterned into predetermined configurations. As can be seen from the figures, each of the transistor part (FIG. 16A) and the contact part (FIG. 16B) includes the first and second layers of the layouts, the patterns of which are coincident with each other (see FIGS. 16A–16C).

Then, a gate electrode layer 91 is covered with an interlayer insulating layer 93 formed on the whole surface. At the aluminium contact part (FIG. 17C), an opening 94 for a contact is formed. An aluminium layer is formed over the interlayer insulating film 93 including the opening 94, and is patterned into a predetermined configuration for forming an aluminium interconnection 95. Thus, the interlayer insulating film 93 functions as an interlayer insulating film for insulating the interconnection structure in the second layer from the aluminium interconnection layer and others (see FIGS. 17A–17C).

The polysilicon gate electrode layer may have a two-layer structure formed of polysilicon and metal compound such as tungsten silicide or titanium silicide for reducing an interconnection resistance.

Figure 2:
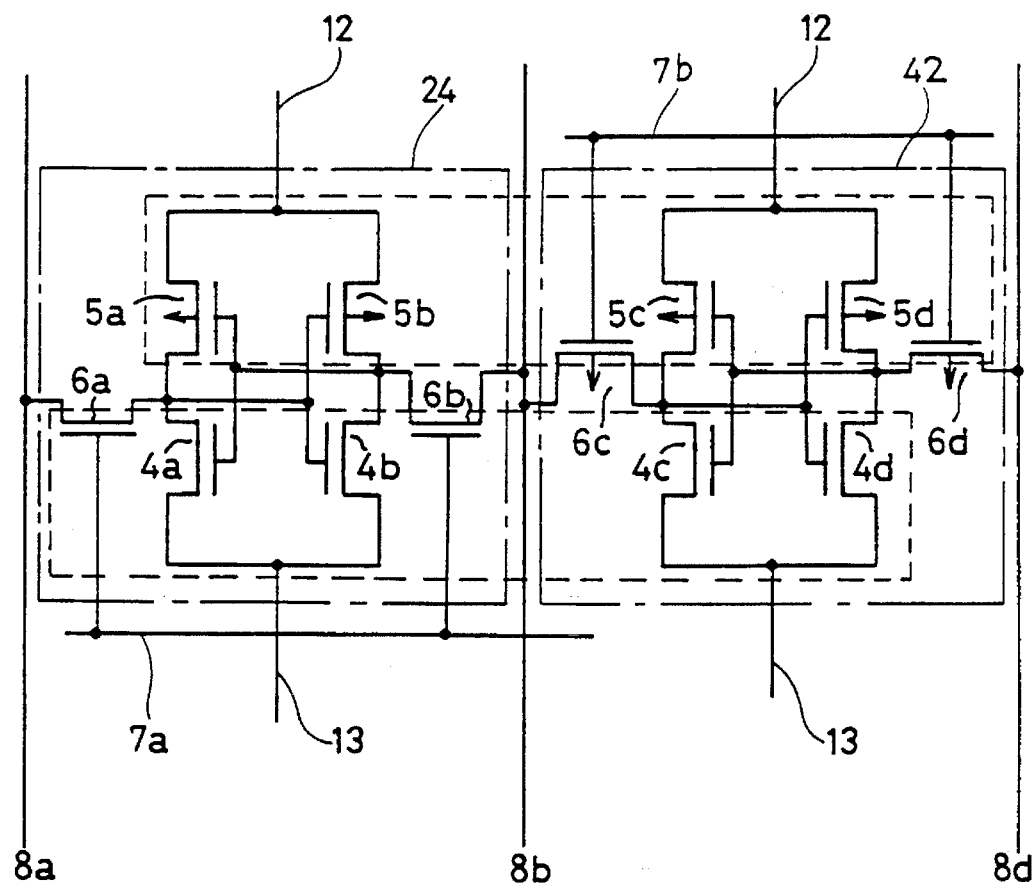
FIG. 2 is an equivalent circuit diagram showing a modification of memory cell structures in FIG. 1.

FIG. 2 is an equivalent circuit diagram showing structures, in which adjacent memory cells themselves have the same structures as those in FIG. 1 but the bit lines 8b and 8c in FIG. 1 are formed of a common line as a bit line 8b. The driver circuit for the word lines 7a and 7b in this embodiment may be the same as those shown in FIGS. 3 and 4, but it is necessary to independently drive the respective word lines, because the bit line 8b is commonly used. The structures for the adjacent memory cells in FIG. 2 can likewise achieve the effect similar to that by the memory cells in FIG. 1 in connection with the occupied area.

[Second Embodiment]

Figure 18:
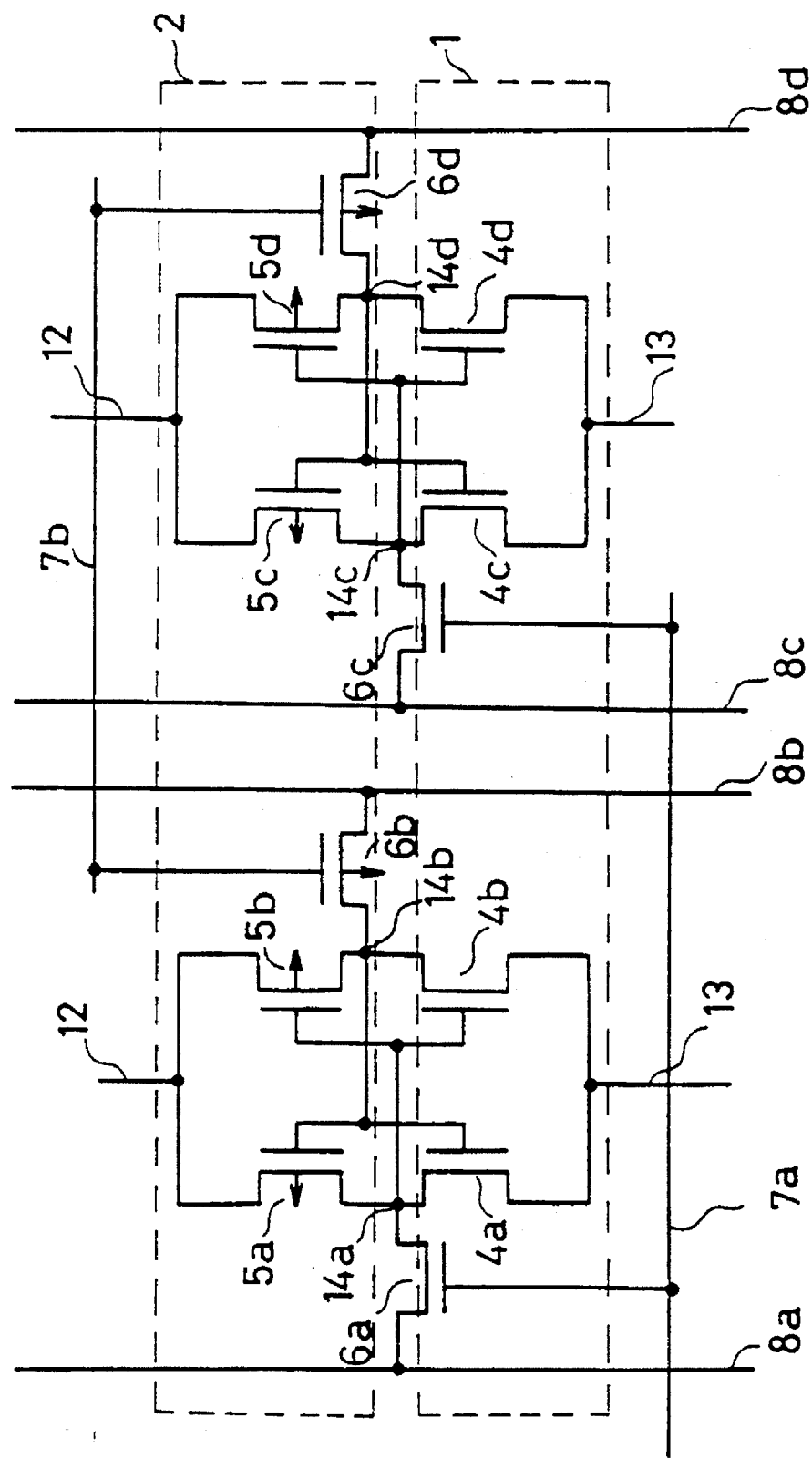
FIG. 18 is an equivalent circuit diagram showing structures of memory cells of a second embodiment of the invention.

FIG. 18 is an equivalent circuit diagram of memory cell structures of a second embodiment of the invention.

In this embodiment, the access transistors 6a and 6b included in the same memory cell are formed in the different layers, i.e., the first and second layers 1 and 2, respectively. Thus, each memory cell has a 3/3 structure in which the first layer includes three transistors and the second layer also includes three transistors.

Figure 19:
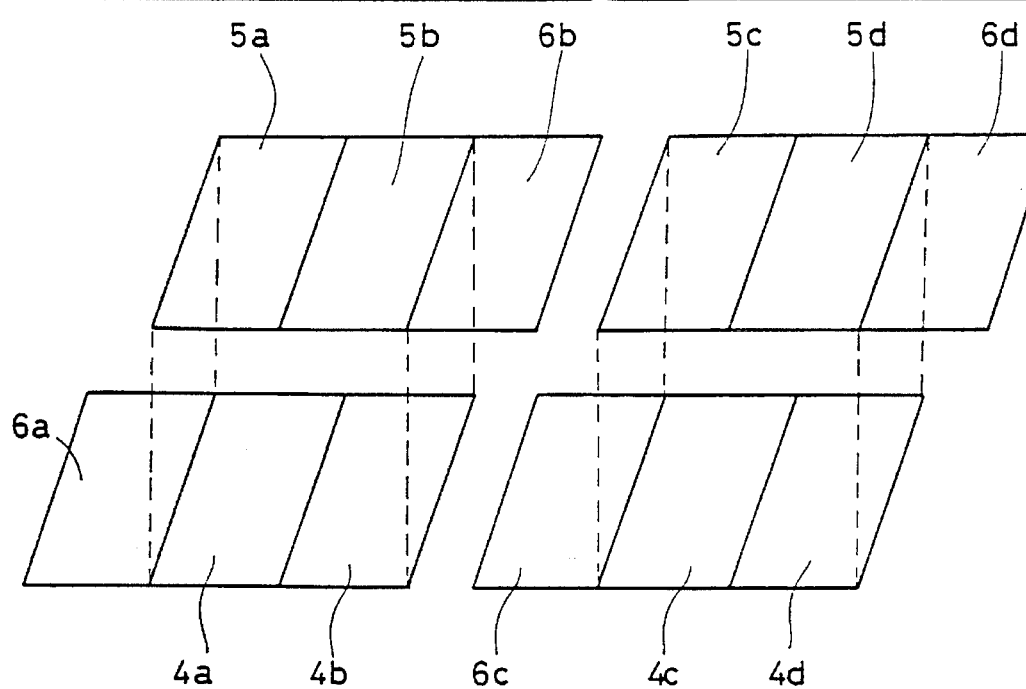
FIG. 19 is a perspective view showing an element layout corresponding to an equivalent circuit in FIG. 18.

As can be seen from FIG. 19, which shows a layout of elements corresponding to the equivalent circuit in FIG. 18, the access transistor 6b in one of memory cells 33a has a portion which is located over a portion of the access transistor 6c of the other memory cell 33 neighboring thereto, whereby the occupied area can be effectively utilized as a whole. The driver circuits for driving the bit lines 7a and 7b may have the structures in the first embodiment shown in FIGS. 3 and 4, but it is necessary to control the driver circuit of the word lines to select both the word lines 7a and 7b simultaneously, because the conductivity types of the access transistors included in the same memory cell are different from each other.

Figure 20:
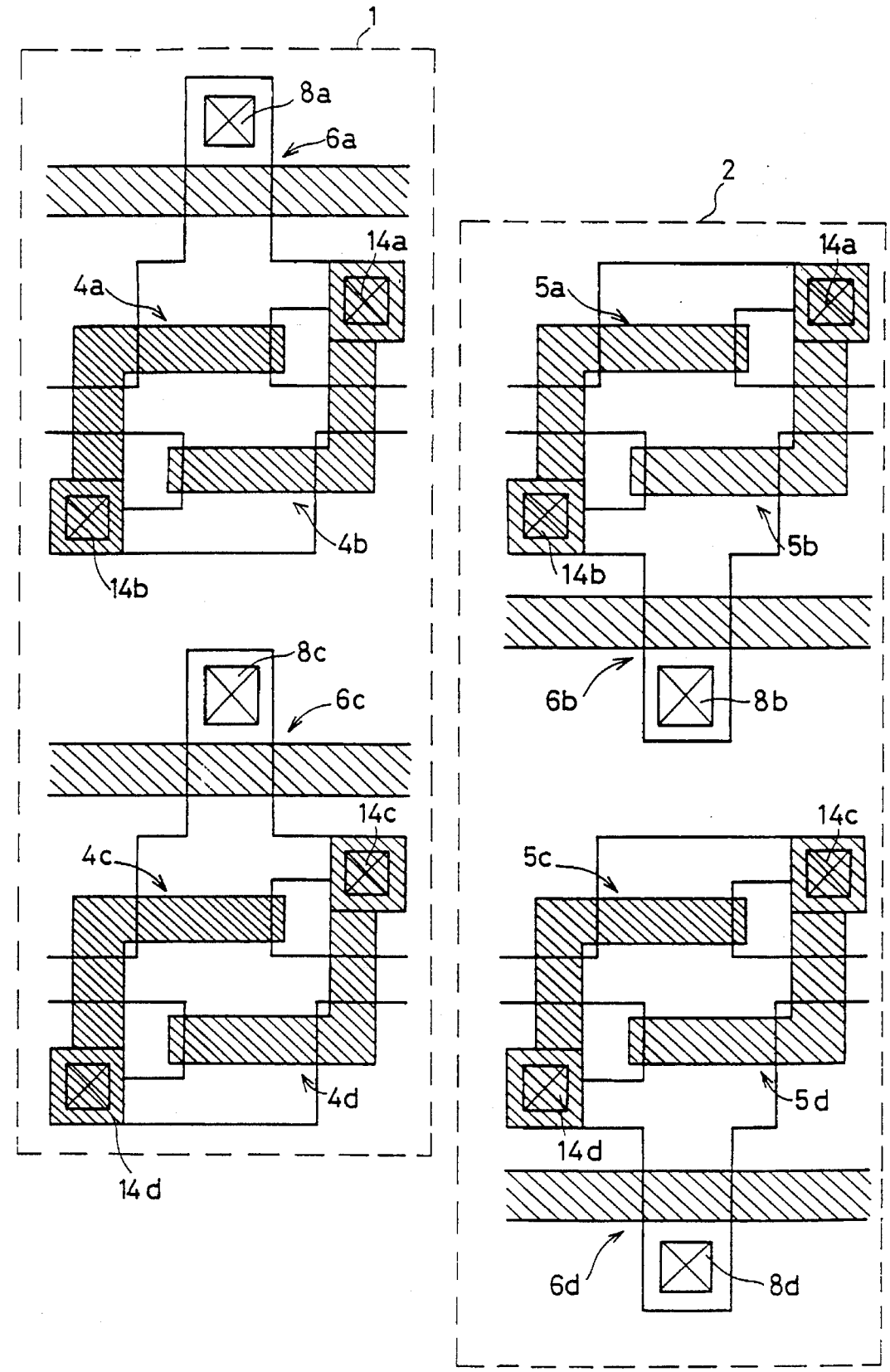
FIG. 20 shows a specific interconnection pattern of memory cell structures in FIG. 18.

FIG. 20 shows a specific interconnection pattern of the equivalent circuit in FIG. 18.

According to the layout in FIG. 20, the access transistor 6b of the memory cell 33a can be located over the access transistor 6c of the other memory cell 33b neighboring thereto. The structures other than those described above are basically similar to those in FIG. 7.

[Third Embodiment]

Figure 21:
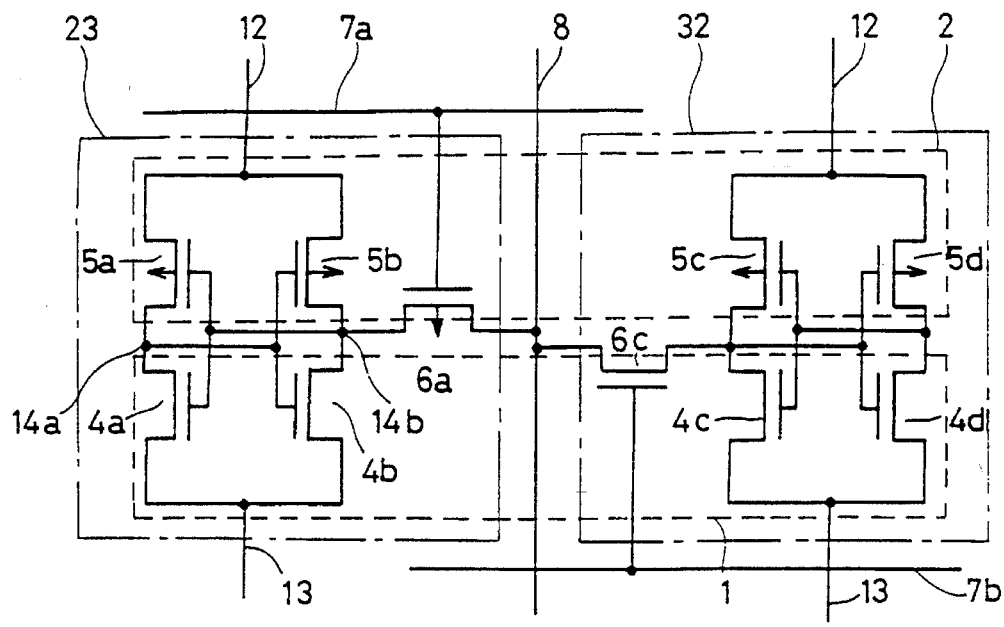
FIG. 21 is an equivalent circuit diagram showing structures of memory cells in a third embodiment of the invention.

FIG. 21 is an equivalent circuit diagram showing structures of memory cells of a third embodiment of the invention.

In this embodiment, one of the adjacent memory cells 23 is of a 2/3 type, and the other memory cell 32 is of a 3/2 type. In this embodiment, there is provided only one access transistor, which is connected to the bit line 8, in one memory cell. The reason is as follows.

A potential of the memory node is stable in the case where the transistors comparing to bulk is formed in the second layer, compared with the SRAM using polysilicon TFTs. Therefore, it is not necessary to fetch a potential difference between memory nodes, which are located at opposite sides of a bit line pair, to the bit line pair for reading the same, as is done in the prior art, but it is possible to directly fetch the potential of the memory node at one side for reading the change of the fetched potential, whereby the information stored in the memory cell can be recognized.

Figure 23:
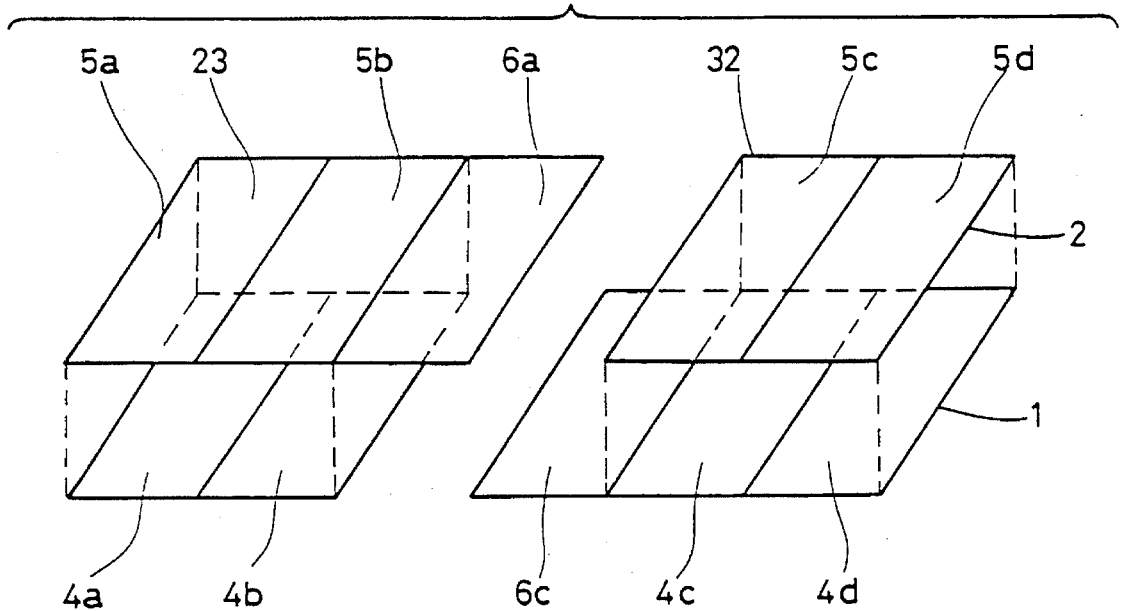
FIG. 23 is a perspective view showing an element layout corresponding to an equivalent circuit in FIG. 18.

FIG. 23 is a perspective view showing a layout of elements corresponding to the equivalent circuit in FIG. 21. As can be seen from the figure, the neighboring memory cells are disposed in an alternate fashion in which the access transistor 6a in one of the adjacent two memory cells is located above the access transistor 6c of the other memory cell, whereby the occupied area of the memory cells can be reduced.

Figure 22:
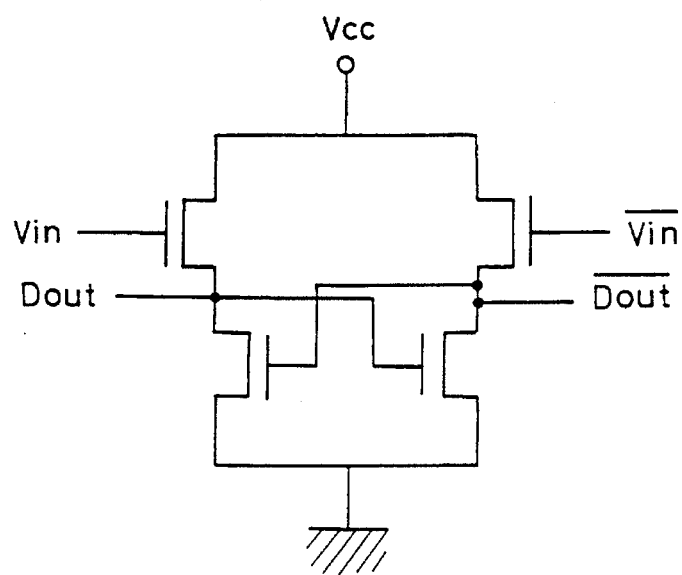
FIG. 22 is a circuit diagram showing a specific structure of a sense amplifier connected to a bit line in memory cell structures in FIG. 21.

FIG. 22 shows a specific structure of a sense amplifier circuit connected to the bit line 8 in FIG. 21.

The circuit shown in FIG. 22 is of a so-called "NMOS cross-couple type", and has been generally used, e.g., in a sense amplifier in a dynamic random access memory (DRAM). In the DRAM, only one bit line is connected to one memory cell. Therefore, the one bit line is connected to the terminal Vin in FIG. 22, and the terminal $\overline{Vin}$ is connected to the bit line for another memory cell, which is designed not to be accessed simultaneously with the memory cell in FIG. 22.

Also in the memory cell of the SRAM in FIG. 21, the bit line 8 is connected to the terminal Vin, and the terminal $\overline{Vin}$ is connected to the bit line of another memory cell, which is not accessed simultaneously, or is connected to the power supply potential Vcc. Thereby, the information in each memory cell shown in FIG. 21 can be read.

[Fourth Embodiment]

Figure 24:
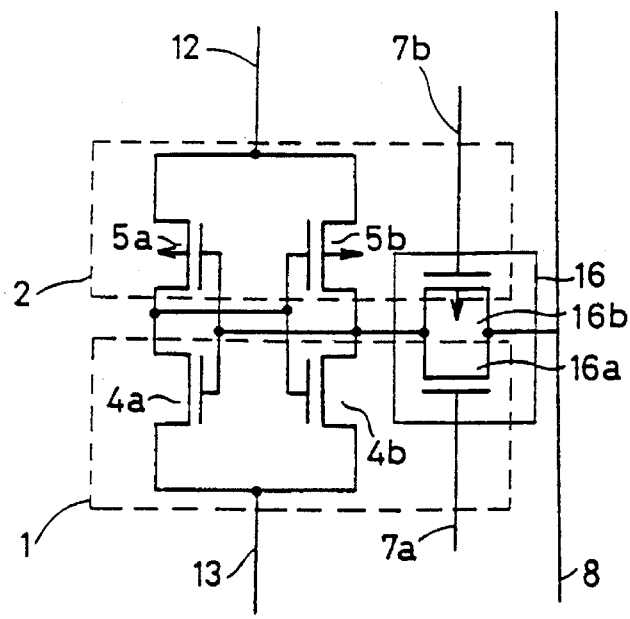
FIG. 24 is an equivalent circuit diagram showing a structures of a memory cell in a fourth embodiment of the invention.

FIG. 24 is an equivalent circuit diagram showing memory cell structures of a fourth embodiment of the invention.

In the third embodiment described before, one memory cell has one access transistor. Meanwhile, in this embodiment, one transfer gate is provided for one memory cell. More specifically, a transfer gate 16 is formed of combination of an NMOS access transistor 16a and a PMOS access transistor 16b. The transfer gate 16 connects the bit line 8 to a flip-flop formed of the driver transistors 4a and 4b and the load transistors 5a and 5b. The transfer gate 16 is connected to the memory node 14b. In this embodiment, the first layer 1 is provided with the driver transistors 4a and 4b and the access transistor 16a of the transfer gate 16, and the second layer 2 is provided with the load transistors 5a and 5b and the access transistor 16b of the transfer gate 16.

Figure 25:
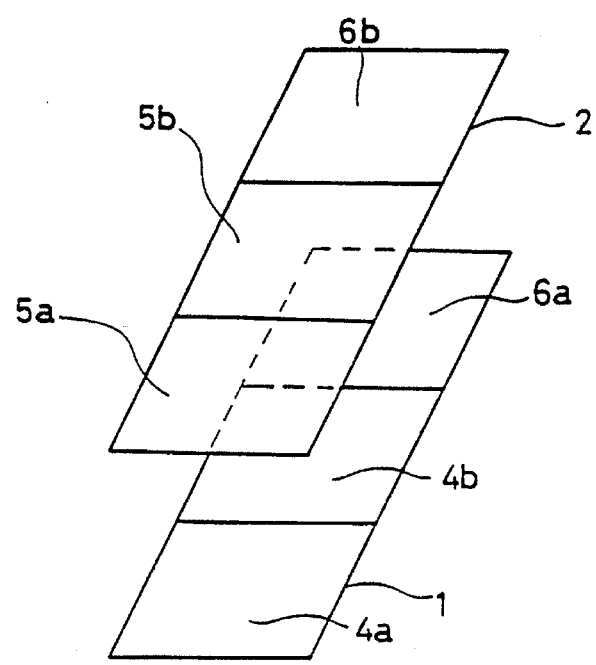
FIG. 25 is a perspective view showing an element layout corresponding to an equivalent circuit in FIG. 24.

FIG. 25 is a perspective view showing an element layout corresponding to the equivalent circuit in FIG. 24. As can be seen from FIG. 25, the memory cell in this embodiment includes the first layer provided with three transistors and the second layer provided with three transistors. Therefore, the memory cells can be formed without a superfluous region, and thus the area occupied by the memory cells can be reduced.

The memory cell structure in this embodiment has the feature and advantage not included and obtained in the third embodiment. The memory cell in FIG. 21 includes the access transistor of only one type, i.e., NMOS type or PMOS type. Therefore, in the data write operation, and particularly in an operation for accessing the memory node through the bit line for inverting the data, a difference corresponding to the threshold of the access transistor generates between the potentials of the bit line and the memory node. The write operation of the memory cell becomes unstable due to this potential difference.

This disadvantage will be described below, for example, in connection with the case where the memory node 14b in FIG. 21 has already held the information at the "H" level, and the word line 7a and bit line 8 are set at the "L" level for writing the information at the "L" level into the memory node 14b. First, the access transistor 6a is turned on, so that the current flows from the memory node 14b at the "H" level toward the bit line 8, reducing the potential of the memory node 14b. When the potential of the memory node 14b lowers to the threshold of the access transistor 6a, the access transistor is turned off. As a result, the potential of the memory node 14b does not lower sufficiently, so that the information holding operation of the memory cell becomes unstable.

Meanwhile, the structure of the memory cell in FIG. 24 uses the transfer gate 16 instead of the access transistor. Therefore, either the transistor 16a of the NMOS type or the transistor 16b of the PMOS type attains the on-state in the read/write operation. Consequently, the memory cell does not suffer the unstable read/write operations and other unstable operations, which may be caused in the transistor of the third embodiment due to the threshold. Further, since there is no influence by the threshold voltage of the access transistor, the information at the "H" level or "L" level, or the like can be written into the memory cell in accordance with the potential of the bit line without reducing the potential, so that the reliability of the write operation is improved.

[Fifth Embodiment]

Figure 26:
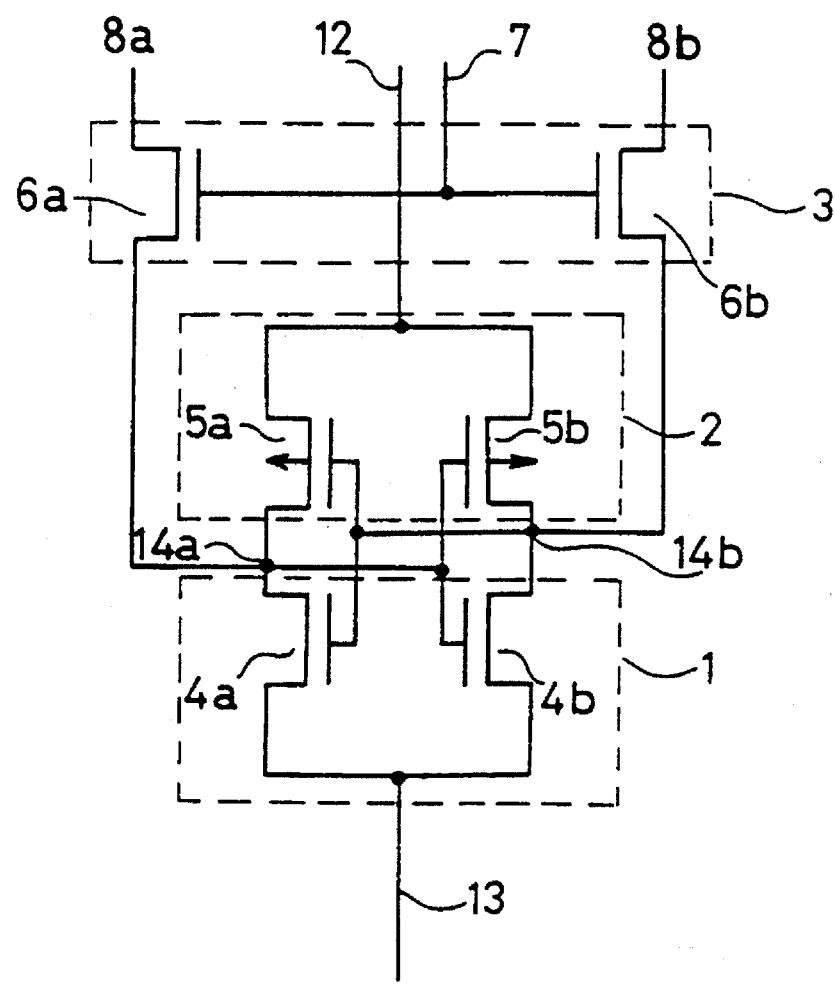
FIG. 26 is an equivalent circuit diagram showing a structure of a memory cell of a fifth embodiment of the invention.

FIG. 26 is an equivalent circuit diagram showing a memory cell structure of a fifth embodiment of the invention.

Figure 33:
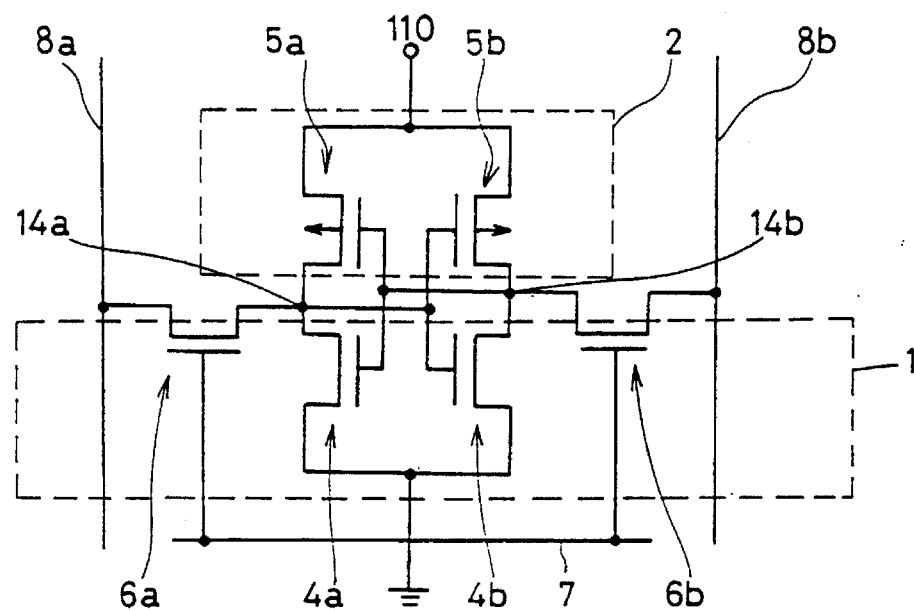
FIG. 33 is an equivalent circuit diagram showing a specific memory cell structure of an improvement of a memory cell in FIG. 32.
Figure 34:
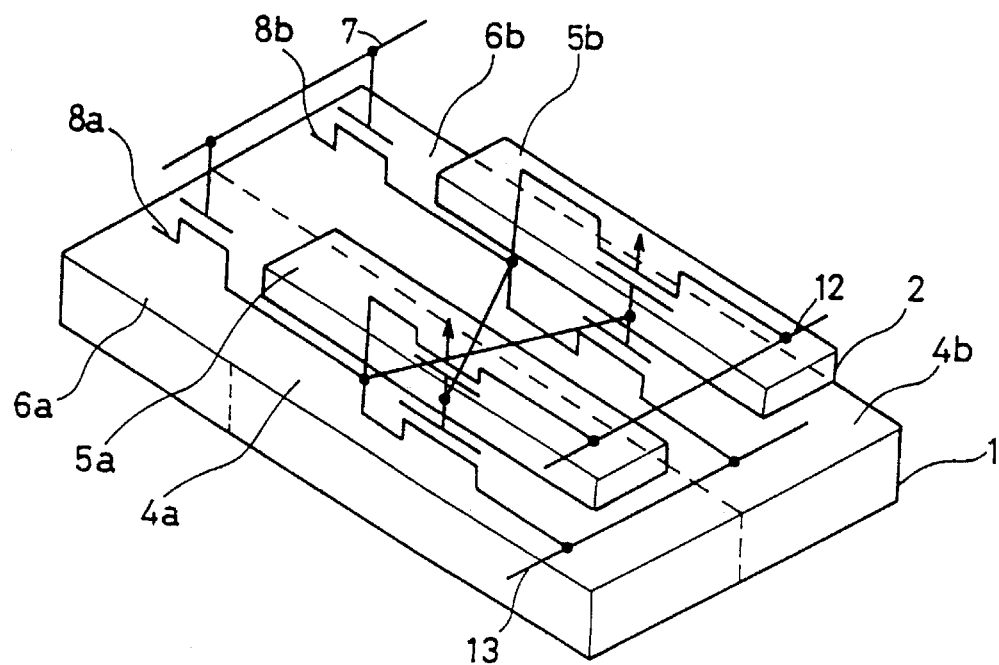
FIG. 34 is a perspective view showing specific structures of memory cells on a semiconductor substrate.
Figure 35:
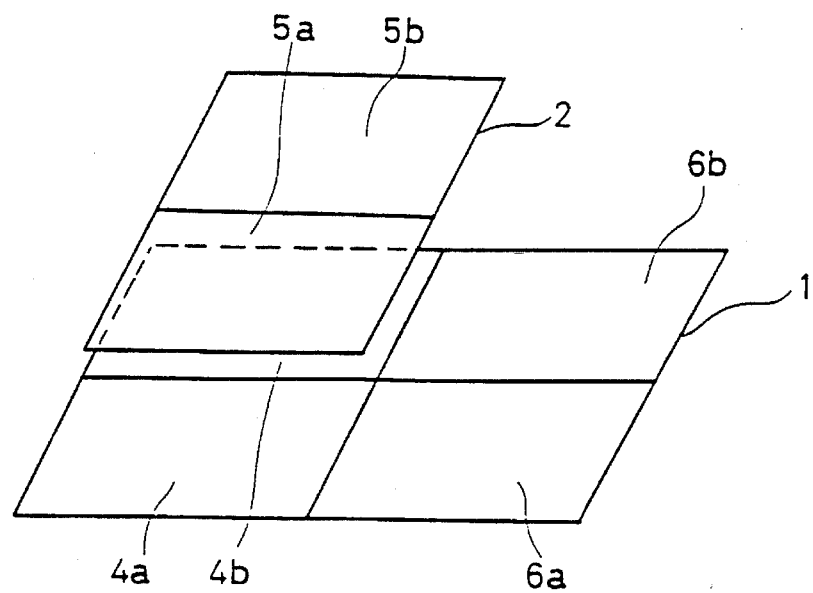
FIG. 35 is a perspective view showing an element layout corresponding to an equivalent circuit in FIG. 33.
Figure 36:
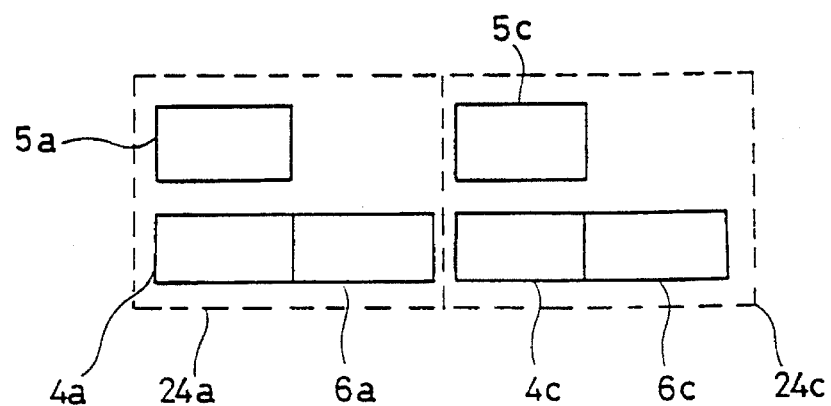
FIG. 36 is a cross section of structures of memory cells in FIG. 35.

Logic elements forming the memory cell are equal in number and type to the logic elements of the memory cell in FIG. 33. However, in this embodiment, the memory cell has a three-layer structure. The first layer 1 is provided with the driver transistors 4a and 4b, the second layer 2 is provided with load transistors 5a and 5b, and a third layer 3 is provided with the access transistors 6a and 6b.

Figure 28:
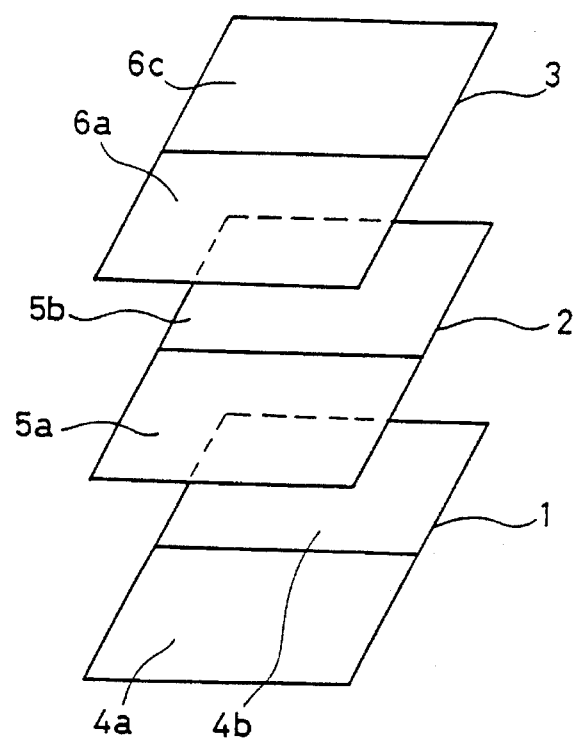
FIG. 28 is a perspective view showing an element layout corresponding to an equivalent circuit in FIG. 26.
Figure 29:
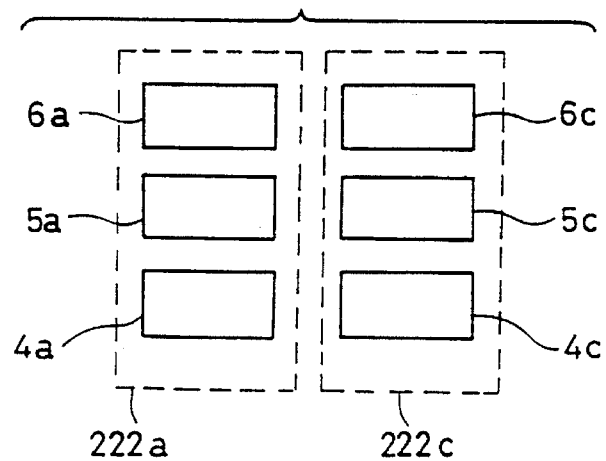
FIG. 29 is a cross section of a structure of a memory cell in FIG. 28.

FIG. 28 is a perspective view showing an element layout corresponding to the equivalent circuit in FIG. 26, and FIG. 29 is a cross sections thereof.

As can be seen from these figures, the memory cell in this embodiment is an SRAM memory cell of the three-layer structure, in which the three layers each are provided with two transistors, and thus will be referred to as "3/3/3 type memory cell" hereinafter.

Figure 27A:
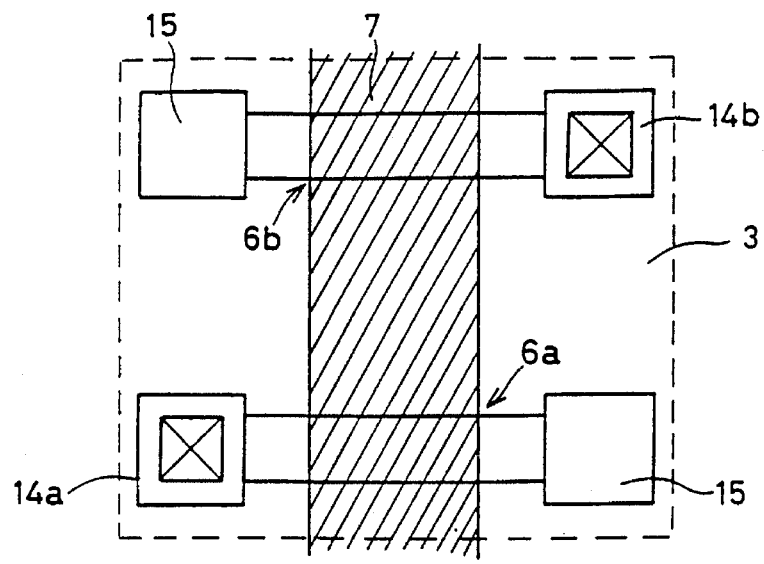
FIGS. 27A–27C show a specific interconnection pattern of a memory cell structure in FIG. 26.
Figure 27B:
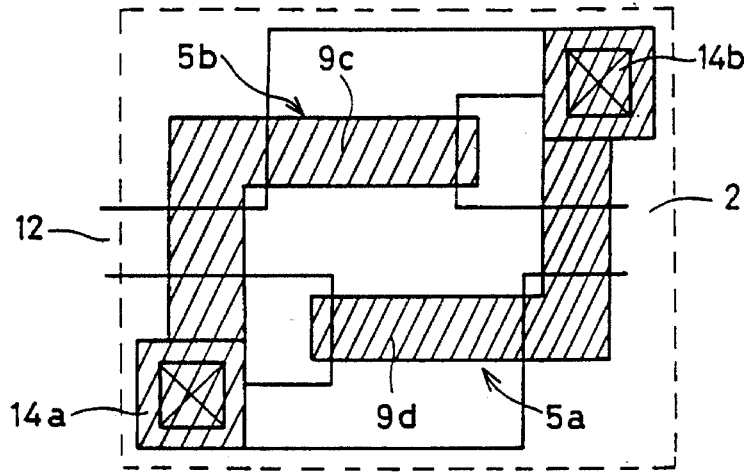
Figure 27C:
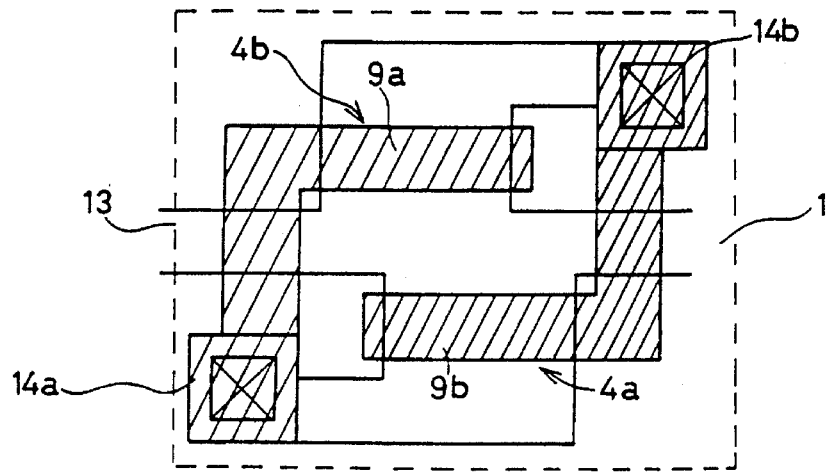

FIGS. 27a–27C show a specific example of an interconnection pattern of the SRAM of the three-layer structure.

In this example, the access transistors 6a and 6b are formed in the third layer by the following reason. The bit lines 8a and 8b and the word line 7 are connected to these access transistors. The provision of the access transistors in the third layer reduces heights of contacts, which increases a margin for a manufacturing process. However, the access transistors 6a and 6b may be disposed in the first or second layer, in which case the layers each include the transistors of the same number, i.e., two, so that the occupied area of the memory cells can be advantageously reduced as a whole.

In the embodiments described above, the driver transistors are disposed in the first layer, and the load transistors are disposed in the second layer. The driver transistors and load transistors can achieve the intended function only by the complementary operations of them. Therefore, the transistors in either layer can be referred to as the driver transistors or load transistors. Therefore, the effect similar to that by the foregoing embodiments can be obtained in the memory cells in which the first layer is provided with the load transistors and the second layer is provided with the driver transistors. In the embodiments and examples described before, the invention is applied to the memory cells in the SRAM. However, the invention may be applied to memory cells of other memory devices as well as semiconductor devices forming logic elements.

[Sixth Embodiment]

Figure 30:
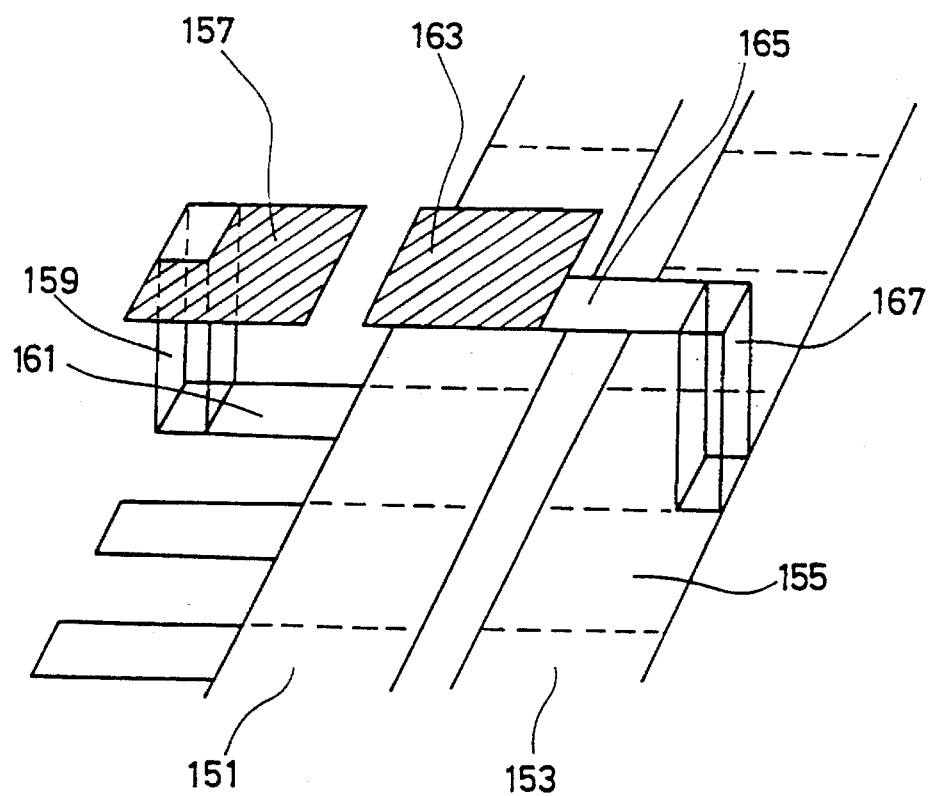
FIG. 30 is a perspective view showing a structure of a photo detector of a sixth embodiment of the invention.
Figure 31:
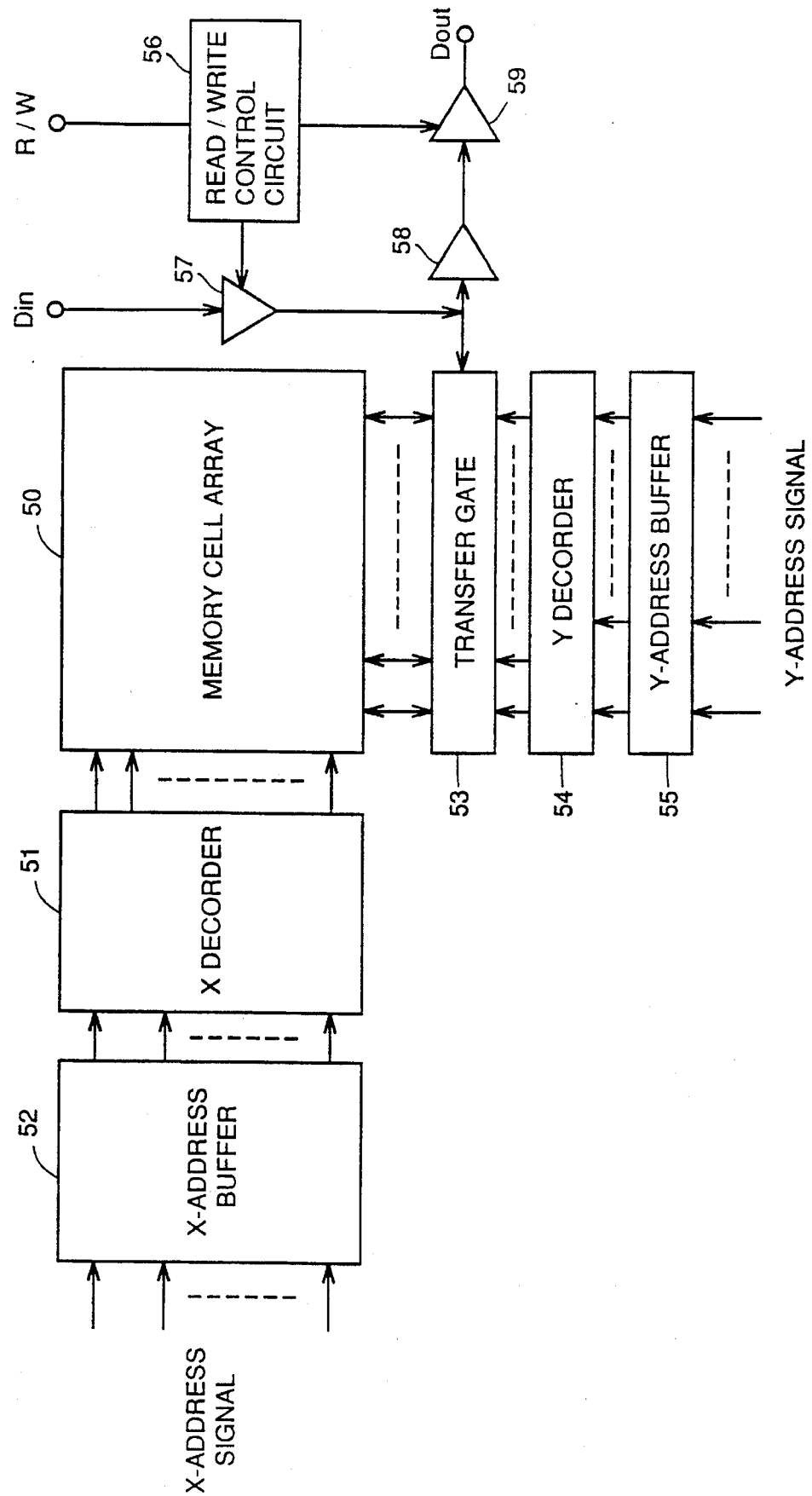
FIG. 31 is a block diagram showing a system structure of an SRAM in the prior art.
Figure 32:
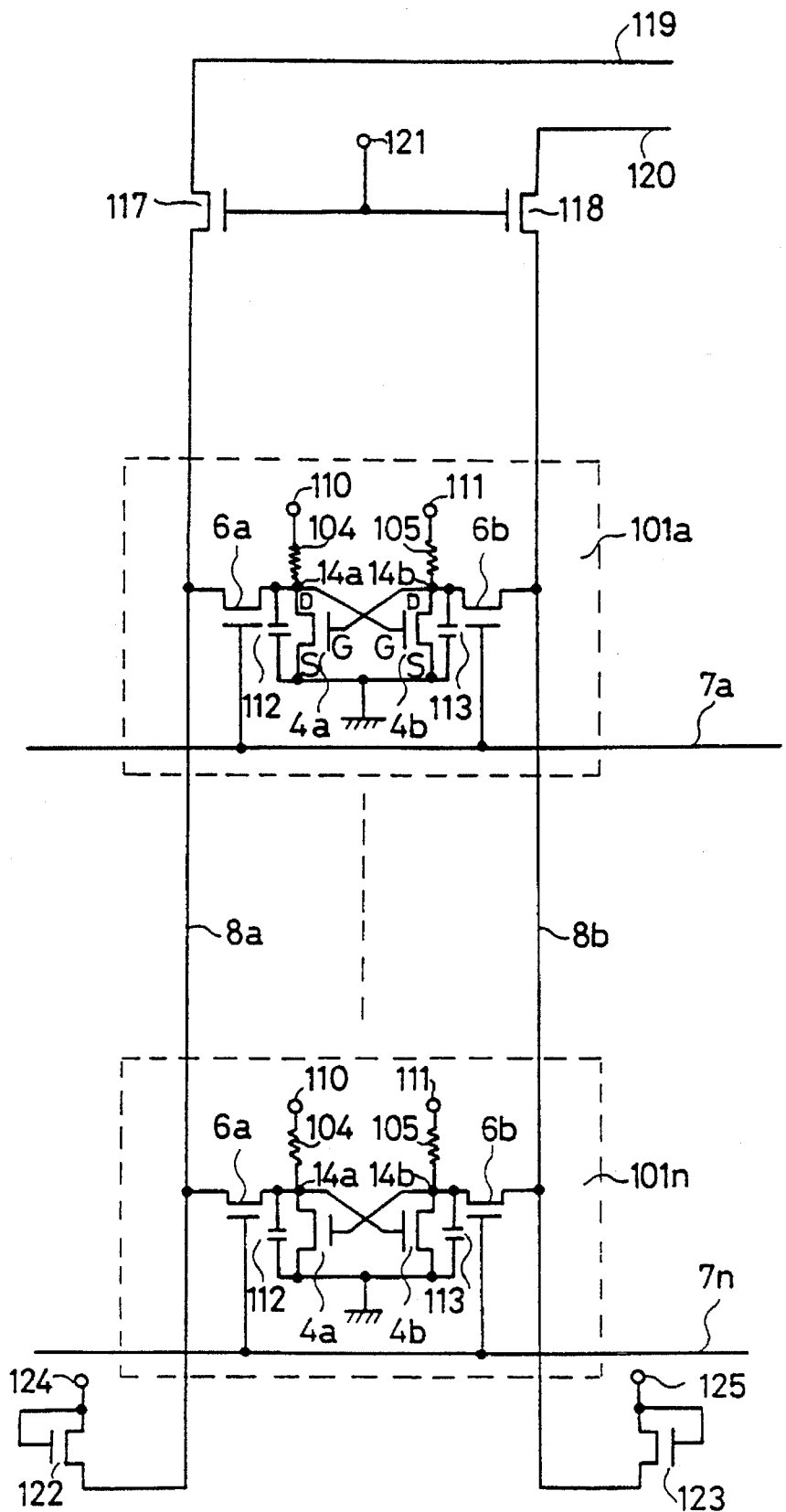
FIG. 32 is a circuit diagram showing a specific structure of a memory cell array in FIG. 31.

FIG. 30 is a perspective view of a sixth embodiment of the invention in which the invention is applied to a photo sensor.

In FIG. 30, there is formed an element unit including a first (lower) layer which is provided with a CCD 151 and an access transistor 161, and a second (upper) layer which is provided with a photo detector 157. There is also provided an element unit including a first layer which is provided with only a CCD 153, and a second layer which is provided with a photo detector 163 and an access transistor 165 and is connected to the first layer through a contact 167. These element units are disposed alternately to each other, whereby an area occupied by the detectors can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device including a first memory cell and a second memory cell neighboring to said first memory cell, each utilizing transistors which form a flip-flop, for storing information, wherein said first memory cell includes:
a pair of first driver transistors forming a part of a first flip-flop;
a pair of first load transistors forming another part of said first flip-flop and each being connected to each of said first driver transistors;
first supply potential applying means connected to each of said first load transistors for applying a supply potential;
first ground potential applying means connected to each of said first driver transistors for applying a ground potential;
a pair of first access transistors each being connected to a connection portion between each of said first driver transistors and each of said first load transistors;
a pair of first bit lines each connected to a respective one of said first access transistors; and
a first word line connected to a gate electrode of each of said first access transistors; and said second memory cell includes:
a pair of second driver transistors forming a part of a second flip-flop;
a pair of second load transistors forming another part of said second flip-flop and each being connected to each of said second driver transistors;
second supply potential applying means connected to each of said second load transistors for applying a supply potential;
second ground potential applying means connected to each of said second driver transistors for applying a ground potential;
a pair of second access transistors each being connected to a connection portion between each of said second driver transistors and each of said second load transistors;
a pair of second bit lines each connected to a respective one of said second access transistors; and
a second word line connected to a gate electrode of each of said second access transistors; wherein said first and second memory cells each have only a single pair of access transistors, and said first and second driver transistors and said first access transistors are of a first conductivity type, and said first and second load transistors and said second access transistors are of a second conductivity type.

2. A semiconductor memory device including a first memory cell and a second memory cell neighboring to said first memory cell, each utilizing transistors which form a flip-flop, for storing information, wherein said first memory cell includes:
a pair of first driver transistors forming a part of a first flip-flop;
a pair of first load transistors forming another part of said first flip-flop and each being connected to each of said first driver transistors;
first supply potential applying means connected to each of said first load transistors for applying a supply potential;
first ground potential applying means connected to each of said first driver transistors for applying a ground potential;
a pair of first access transistors each being connected to a connection portion between each of said first driver transistors and each of said first load transistors;
a pair of first bit lines each connected to a respective one of said first access transistors; and
a first word line connected to a gate electrode of each of said first access transistors; and said second memory cell includes:
a pair of second driver transistors forming a part of a second flip-flop;
a pair of second load transistors forming another part of said second flip-flop and each being connected to each of said second driver transistors;
second supply potential applying means connected to each of said second load transistors for applying a supply potential;
second ground potential applying means connected to each of said second driver transistors for applying a ground potential;
a pair of second access transistors each being connected to a connection portion between each of said second driver transistors and each of said second load transistors;
a pair of second bit lines each connected to a respective one of said second access transistors; and
a second word line connected to a gate electrode of each of said second access transistors; and wherein said first and second driver transistors and said first access transistors are of a first conductivity type, and said first and second load transistors and said second access transistors are of a second conductivity type, the transistors of said first conductivity type are formed in a first layer in a semiconductor substrate, the transistors of said second conductivity type are formed in a second layer which is formed on said first layer with an insulating layer therebetween, the number of transistors in the first layer is equal to the number of transistors in the second layer, and said second access transistors are located above the first access transistors.

3. A semiconductor memory device according to claim 1, wherein the transistors of said second conductivity type include an SOI transistor.

4. A semiconductor memory device according to claim 1, wherein the first and second driver transistors of said first conductivity type have a first interconnection pattern and the first and second load transistors of the second conductivity type have a second interconnection pattern, identical to said first interconnection pattern.

5. A semiconductor memory device according to claim 1, wherein said first memory cell is selected when said first word line attains a first potential level, and said second memory cell is selected when said second word line attains a second potential level.

6. A semiconductor memory device according to claim 1, wherein the transistors of said first conductivity type are n-channel MOS transistors, and the transistors of said second conductivity type are p-channel MOS transistors.

7. A semiconductor memory device according to claim 1, wherein one bit line of said first bit line pair being common with one bit line of said second bit line pair.

8. A semiconductor memory device comprising:

a first memory cell being a 2/4 type; and a second memory cell being a 4/2 type, each of said first and second memory cells having driver transistors formed in a first layer and load transistors formed in a second layer with an insulator layer formed therebetween, a ground line formed in said first layer, a power supply line formed in said second layer, a first capacitor formed between the ground line and a first interconnection line connected between a first contact and a gate of one of the driver transistors through a second insulator layer, and a second capacitor formed between the power supply line and a second interconnection line connected between a second contact and a gate of one of the load transistors through a third insulator layer.

9. A static semiconductor memory device including a first memory cell and a second memory cell neighboring to said first memory cell, each utilizing transistors which form a flip-flop, for storing information, wherein said first memory cell includes:

a pair of first driver transistors forming a part of a first flip-flop;

a pair of first load transistors forming another part of said first flip-flop and each being connected to each of said first driver transistors;

first supply potential applying means connected to each of said first load transistors for applying a supply potential;

first ground potential applying means connected to each of said first driver transistors for applying a ground potential;

a pair of first access transistors each being connected to a connection portion between each of said first driver transistors and each of said first load transistors;

a pair of first bit lines each connected to a respective one of said first access transistors; and a first word line connected to a gate electrode of each of said first access transistors; and said second memory cell includes:

a pair of second driver transistors forming a part of a second flip-flop;

a pair of second load transistors forming another part of said second flip-flop and each being connected to each of said second driver transistors;

second supply potential applying means connected to each of said second load transistors for applying a supply potential;

second ground potential applying means connected to each of said second driver transistors for applying a ground potential;

a pair of second access transistors each being connected to a connection portion between each of said second driver transistors and each of said second load transistors;

a pair of second bit lines each connected to a respective one of said second access transistors; and a second word line connected to a gate electrode of each of said second access transistors; and wherein said first and second memory cells each have only a single pair of access transistors, said first and second driver transistors, one of said first access transistors and one of said second access transistors are only of a first conductivity type, and said first and second load transistors, the other of said first access transistors and the other of said second access transistors are only of a second conductivity type opposite to said first conductivity type.

10. A semiconductor memory device according to claim 9, wherein the transistors of said first conductivity type are formed in a first layer in a semiconductor substrate, and the transistors of said second conductivity type are formed in a second layer which is formed on said first layer with an insulating layer therebetween.

11. A static semiconductor memory device including a first memory cell and a second memory cell neighboring to said first memory cell, each utilizing transistors which form a flip-flop, for storing information, wherein said first memory cell includes a pair of first driver transistors forming a part of a first flip-flop, a pair of first load transistors forming another part of said first flip-flop and each being connected to each of said first driver transistors, first supply potential applying means connected to each of said first load transistors for applying a supply potential, first ground potential applying means connected to each of said first driver transistors for applying a ground potential, a pair of first access transistors each being connected to a connection portion between each of said first driver transistors and each of said first load transistors, a pair of first bit lines each connected to a respective one of said first access transistors, and a first word line connected to a gate electrode of each of said first access transistors; and said second memory cell includes
a pair of second driver transistors forming a part of a second flip-flop,
a pair of second load transistors forming another part of said second flip-flop and each being connected to each of said second driver transistors,
second supply potential applying means connected to each of said second load transistors for applying a supply potential,
second ground potential applying means connected to each of said second driver transistors for applying a ground potential;
a pair of second access transistors each being connected to a connection between each of said second driver transistors and each of said second load transistors,
a pair of second bit lines each connected to a respective one of said second access transistors, and
a second word line connected to a gate electrode of each of said second access transistors; and wherein
said first and second driver transistors, one of said first access transistors and one of said second access transistors are of a first conductivity type; and
said first and second load transistors, the other of said first access transistors and the other of said second access transistors are of a second conductivity type opposite to said first conductivity type,
the transistors of said first conductivity type are formed in a first layer in a semiconductor substrate,
the transistors of said second conductivity type are formed in a second layer which is formed on said first layer with an insulating layer therebetween, and
the other of said first access transistors is located above the one of the second access transistors.

12. A static semiconductor memory device including a first memory cell land a second memory cell neighboring to said first memory cell, each utilizing transistors which form a flip-flop, for storing information, wherein said first memory cell includes:
a pair of first driver transistors forming a part of a first flip-flop;
a pair of first load transistors forming another part of said first flip-flop and each being connected to each of said first driver transistors;
first supply potential applying means connected to each of said first load transistors for applying a supply potential;
first ground potential applying means connected to each of said first driver transistors for applying a ground potential;
a first access transistor connected to a connection portion between one of said first driver transistors and one of said first load transistors; and
a first word line connected to a gate electrode of said first access transistor:

said second memory cell includes:
a pair of second driver transistors forming a part of a second flip-flop;
a pair of second load transistors forming another part of said second flip-flop and each being connected to each of said second driver transistors;
second supply potential applying means connected to each of said second load transistors for applying a supply potential;
second ground potential applying means connected to each of said second driver transistors for applying a ground potential;
a second access transistor connected to a connection portion between one of said second driver transistors and one of said second load transistors;
a second word line connected to a gate electrode of said second access transistors: and wherein said first and second memory cells each have only a single access transistor, each of said first and second access transistors are connected to a common bit line, said first and second driver transistors and said second access transistor are of a first conductivity type, and said first and second load transistors and said first access transistor are of a second conductivity type opposite to said first conductivity type.

13. A semiconductor memory device according to claim 12, wherein said transistors of said first conductivity type are formed in a first layer in a semiconductor substrate, and said transistors of said second conductivity type are formed in a second layer which is formed on said first layer with an insulating layer therebetween.

14. A static semiconductor memory device including a first memory cell and a second memory cell neighboring to said first memory cell, each utilizing transistors which form a flip-flop, for storing information, wherein said first memory cell includes:
a pair of first driver transistors forming a part of a first flip-flop;
a pair of first load transistors forming another part of said first flip-flop and each being connected to each of said first driver transistors;
first supply potential applying means connected to each of said first load transistors for applying a supply potential;
first ground potential applying means connected to each of said first driver transistors for applying a ground potential;
a first access transistor connected to a connection portion between one of said first driver transistors and one of said first load transistors; and
a first word line connected to a gate electrode of said first access transistor;

said second memory cell includes:
a pair of second driver transistors forming a part of a second flip-flop;
a pair of second load transistors forming another part of said second flip-flop and each being connected to each of said second driver transistors;
second supply potential applying means connected to each of said second load transistors for applying a supply potential;
second ground potential applying means connected to each of said second driver transistors for applying a ground potential;
a second access transistor connected to a connection portion between one of said second driver transistors and one of said second load transistors;
a second word line connected to a gate electrode of said second access transistors; wherein each of said first and second access transistors are connected to a common bit line, said first and second driver transistors and said second access transistor are of a first conductivity type, and said first and second load transistors and said first access transistor are of a second conductivity type opposite to said first conductivity type, said transistors of said first conductivity type are formed in a first layer in a semiconductor substrate, and said transistors of said second conductivity type are formed in a second layer which is formed on said first layer with an insulating layer therebetween, and said first access transistor is located above said second access transistor.

15. A memory cell structure of a semiconductor memory device using transistors which form a flip-flop, for storing information, said memory cell structure comprising:

a pair of driver transistors forming a part of said flip-flop; and a pair of load transistors forming another part of said flip-flop and each being connected to each of said driver transistors, said memory cell structure having only a single transfer gate formed of a transistor of a first conductivity type and a second transistor of a second conductivity type opposite to said first conductivity type, and being connected to a connection portion between one of said driver transistors and one of said load transistors for transferring the potential of said connection portion to a bit line, wherein said driver transistors are of said first conductivity type, and said load transistors are of said second conductivity type, and wherein the transistors of said first conductivity type are formed in a first layer in a semiconductor substrate, and the transistors of said second conductivity type are formed in a second layer which is formed on said first layer with an insulating layer therebetween.

16. A memory cell structure according to claim 15, further comprising:

supply potential applying means connected to each of said load transistors for applying a supply potential; and ground potential applying means connected to each of said driver transistors for applying a ground potential.

17. A memory cell structure according to claim 15, wherein the transfer gate transistor of said first conductivity type has a gate electrode connected to a word line; and the transfer gate transistor of said second conductivity type has a gate electrode connected to another word line.

18. A memory cell structure according to claim 15, wherein said load transistors are located above said driver transistors, and the transistors of said second conductivity type are located above the transistors of said first conductivity type; and the second transistor of a second conductivity type of the transfer gate is located above the transistor of a first conductivity type of the transfer gate.

19. A photo sensor formed of a first element unit and a second element unit neighboring to said first element unit, wherein said first element unit includes:

a first CCD and a first access transistor which are formed in a first layer and are connected to each other;

a first photo detector formed in a second layer; and a first contact connecting said access transistor to said first photo detector: and said second element unit includes:

a second CCD formed in said first layer;

a second photo detector and a second access transistor which are formed in said second layer and are connected to each other; and a second contact connecting said second CCD to said second access transistor.

20. A semiconductor device of a static RAM comprising:

a first memory cell including
a pair of load transistors,
a pair of driver transistors, and
a pair of access transistors; and a second memory cell neighboring to said first memory cell including
a pair of load transistors,
a pair of driver transistors, and
a pair of access transistors, wherein two pairs of transistors of said first memory cell are formed in a first layer, a pair of transistors of said first memory cell is formed in a second layer above said first layer, a pair of transistors of said second memory cell is formed in said first layer, and two pairs of transistors of said second memory cell are formed in said second layer, wherein said pair of load transistors of said first memory cell are formed in said second layer directly over said pair of driver transistors of said first memory cell formed in said first layer, said pair of load transistors of said second memory cell are formed in said second layer directly over said pair of driver transistors of said second memory cell formed in said first layer, and said pair of access transistors of said first memory cell are formed in said first layer and said pair of access transistors of said second memory cell are formed in said second layer with at least a portion of said pair of access transistors of said second memory cell directly over said pair of access transistors of said first memory cell.

* * * * *